(12) United States Patent
Funamoto et al.

(10) Patent No.: US 10,177,878 B2
(45) Date of Patent: Jan. 8, 2019

(54) INFORMATION PROCESSING FOR DETECTION OF CONTROL CODE

(71) Applicant: SONY CORPORATION, Tokyo (JP)

(72) Inventors: Kazuhisa Funamoto, Kanagawa (JP);
Tatsuo Shinbashi, Tokyo (JP); Tatsuya Sugioka, Tokyo (JP); Kenichi Maruko, Kanagawa (JP); Naohiro Koshisaka, Hokkaido (JP); Hiroo Takahashi, Tokyo (JP)

(73) Assignee: SONY CORPORATION, Tokyo (JP)

( * ) Notice: Subject to any disclaimer, the term of this patent is extended or adjusted under 35 U.S.C. 154(b) by 107 days.

(21) Appl. No.: 15/404,381

(22) Filed: Jan. 12, 2017

(65) Prior Publication Data

US 2017/0126361 A1 May 4, 2017

Related U.S. Application Data

(62) Division of application No. 14/353,912, filed as application No. PCT/JP2012/081056 on Nov. 30, 2012, now Pat. No. 9,565,424.

(30) Foreign Application Priority Data

Dec. 9, 2011 (JP) ................. 2011-269877

(51) Int. Cl.
*H03M 5/14* (2006.01)
*H04L 1/00* (2006.01)
(Continued)

(52) U.S. Cl.
CPC .......... *H04L 1/0072* (2013.01); *H03M 5/145* (2013.01); *H04L 1/0045* (2013.01);
(Continued)

(58) Field of Classification Search
CPC ..... H04N 17/002; H04N 5/378; H03M 5/145; H04L 1/0045; H04L 25/4908; H04L 1/0057
See application file for complete search history.

(56) References Cited

U.S. PATENT DOCUMENTS 6,812,870 B1 11/2004 Kryzak et al.
2002/0136318 A1 9/2002 Gorokhov et al.
(Continued)

FOREIGN PATENT DOCUMENTS

JP 10-32504 A 2/1998
JP 2001-156762 A 6/2001
(Continued)

OTHER PUBLICATIONS

International Search Report and Written Opinion of PCT Application No. PCT/JP2012/081056, dated Mar. 5, 2013, 19 pages.

*Primary Examiner* — Michael E Teitelbaum
(74) *Attorney, Agent, or Firm* — Chip Law Group

(57) ABSTRACT

There is provided an information processing device including an acquirer that acquires second data obtained by converting first data constituted by bit data having a first number of bits into symbols having a second number of bits greater than the first number of bits, with respect to each of the bit data, a comparator that compares a first symbol string constituted by a plurality of symbols contained in the second data prior to reverse conversion of the acquired second data into the first data, to a second symbol string representing a code targeted for detection, and a detector that detects the first symbol string as the code targeted for detection from the second data, on the basis of the result of the comparison by the comparator.

7 Claims, 18 Drawing Sheets

(51) Int. Cl.
*H04L 25/49* (2006.01)
*H04N 17/00* (2006.01)
*H04N 5/378* (2011.01)

(52) U.S. Cl.
CPC ........ *H04L 1/0057* (2013.01); *H04L 25/4908* (2013.01); *H04N 5/378* (2013.01); *H04N 17/002* (2013.01)

(56) References Cited

U.S. PATENT DOCUMENTS

| | | |
|---|---|---|
| 2005/0271053 A1 | 12/2005 | Nuyen et al. |
| 2007/0116055 A1 | 5/2007 | Atsumi et al. |
| 2008/0013634 A1 | 1/2008 | Lee et al. |

FOREIGN PATENT DOCUMENTS

| | | |
|---|---|---|
| JP | 2007-110457 A | 4/2007 |
| JP | 2008-502208 A | 1/2008 |
| JP | 2009-177347 A | 8/2009 |

FIG.3

| Control Symbol | | 10B abcdei_fghj | | memo |
|---|---|---|---|---|
| Code | 8B HGF_EDCBA | RD- | RD+ | |
| K23.7 | 11110111 | 1110101000 | 0001010111 | Used in Pad Code |
| K27.7 | 11111011 | 1101101000 | 0010010111 | Used in Start Code |
| K28.0 | 00011100 | 0011110100 | 1100001011 | Reserved |
| K28.1 | 00111100 | 0011111001 | 1100000110 | Reserved |
| K28.2 | 01011100 | 0011110101 | 1100001010 | Used in Start Code |
| K28.3 | 01111100 | 0011110011 | 1100001100 | Reserved |
| K28.4 | 10011100 | 0011110010 | 1100001101 | Used in Pad Code |
| K28.5 | 10111100 | 0011111010 | 1100000101 | Comma Character |
| K28.6 | 11011100 | 0011110110 | 1100001001 | Used in Pad Code |
| K28.7 | 11111100 | 0011111000 | 1100000111 | Used in Pad Code |
| K29.7 | 11111101 | 1011101000 | 0100010111 | Used in End Code |
| K30.7 | 11111110 | 0111101000 | 1000010111 | Used in End Code |

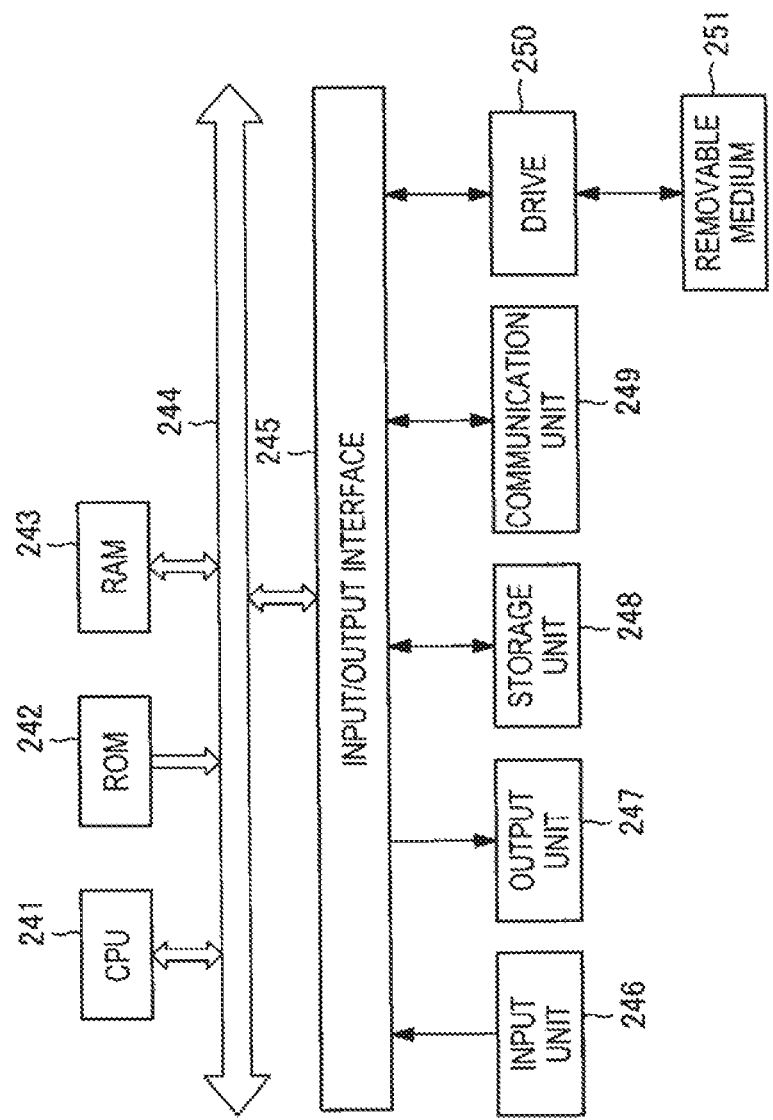

INFORMATION PROCESSING FOR DETECTION OF CONTROL CODE

CROSS REFERENCE TO RELATED APPLICATIONS

The present application is a divisional application of U.S. patent application Ser. No. 14/353,912, filed Apr. 24, 2014, which is a national stage entry of PCT application PCT/JP2012/081056 filed Nov. 30, 2012 and which claims the benefit of Japanese Priority Patent Application No. 2011-269877 filed Dec. 9, 2011, the entire contents of which are incorporated herein by reference.

TECHNICAL FIELD

The present disclosure relates to an information processing device, an information processing method, and a program, and more particularly, to an information processing device, an information processing method, and a program, which can detect a control code accurately, for example, even when an error occurs in the control code.

BACKGROUND ART

For example, an image sensor and a DSP (digital signal processor) are incorporated in a digital camera. The image sensor generates an image signal obtained by photoelectrically converting light received through a lens, and the DSP performs image processing on the image signal output from the image sensor.

When outputting the image signal to the DSP, the image sensor packetizes (partitions) the image signal into a plurality of packets, and adds a control code to each packet. Incidentally, as an example of the control code, a start code representing a start position of the packet or an end code representing an end position of the packet, and the like are added.

Then, the image sensor performs an 8B10B conversion to convert the packet, to which the control code is added, into a bit string of 10 bits for every 8 bits, and outputs the packet after the 8B10B conversion to the DSP.

On the other hand, the DSP performs a 10B8B conversion (8B10B reverse conversion) to convert the packet after the 8B10B conversion, which is output from the image sensor, into a bit string of 8 bits for every 10 bits.

Also, the DSP previously holds a bit pattern representing the control code, and detects the control code from the packet after the 10B8B conversion, on the basis of the held bit pattern.

That is, for example, the DSP detects a bit string matched with the previously held bit pattern, as the control code, among bit strings contained in the packet after the 10B8B conversion.

Then, the DSP extracts an image signal from the packet after the 10B8B conversion, on the basis of the detected control code, and performs image processing on the extracted image signal.

Incidentally, the 8B10B conversion and the 10B8B conversion are performed using, for example, a previously held conversion table (see, for example, Patent Literature 1).

CITATION LIST

Patent Literature

Patent Literature 1: JP 2010-204881A

SUMMARY OF INVENTION

Technical Problem

The DSP detects a bit string matched with a previously held bit pattern, as a control code, among bit strings contained in a packet after a 10B8B conversion.

However, for example, in the case where an error occurs in a bit string as a control code contained in a packet being transmitted from an image sensor to a DSP, the control code cannot be detected because the bit string as the control code is not matched with the previously held bit pattern.

The present disclosure has been made in view of these situations and is directed to detect a control code accurately even when an error occurs in the control code.

Solution to Problem

According to a first embodiment of the present disclosure, there is provided an information processing device including an acquirer that acquires second data obtained by converting first data constituted by bit data having a first number of bits into symbols having a second number of bits greater than the first number of bits, with respect to each of the bit data, a comparator that compares a first symbol string constituted by a plurality of symbols contained in the second data prior to reverse conversion of the acquired second data into the first data, to a second symbol string representing a code targeted for detection, and a detector that detects the first symbol string as the code targeted for detection from the second data, on the basis of the result of the comparison by the comparator.

The detector may include a Hamming calculator that calculates a Hamming distance representing a number of corresponding bits of the first symbol string and the second symbol string that are not matched with each other, on the basis of the result of the comparison by the comparator, and a code detector that detects the first symbol string as the code targeted for detection when the calculated Hamming distance is equal to or less than a predetermined threshold value.

The detector may further include a changer that changes the threshold value according to a detection rate of detecting the code targeted for detection. The code detector may detect the first symbol string as the code targeted for detection when the Hamming distance is equal to or less than the threshold value after the change.

When a first number of bits continuously arranged are not matched among the corresponding bits of the first symbol string and the second symbol string, the Hamming calculator may calculate the Hamming distance by treating the first number of bits as if only a second number of bits less than the first number of bits are not matched.

The threshold value may be predetermined to be less than a minimum value of a Hamming distance between a third symbol string and the second symbol string, the third symbol string being constituted by symbols different from symbols contained in the second symbol string.

The information processing device may further include a reverse converter that generates the first data by converting the acquired second data into the bit data with respect to each of the symbols, and a processor that performs processing on the first data generated by the reverse converter, on the basis of the detected code targeted for detection.

According to the first embodiment of the present disclosure, there is provided an information processing method of an information processing device that detects a predetermined code, the information processing method by the information processing device including an acquiring step of acquiring second data obtained by converting first data constituted by bit data having a first number of bits into symbols having a second number of bits greater than the first number of bits, with respect to each of the bit data, a comparing step of comparing a first symbol string constituted by a plurality of symbols contained in the second data prior to reverse conversion of the acquired second data into the first data, to a second symbol string representing a code targeted for detection, and a detecting step of detecting the first symbol string as the code targeted for detection from the second data, on the basis of the result of the comparison in the comparing step.

According to the first embodiment of the present disclosure, there is a program for causing a computer to function as: an acquirer that acquires second data obtained by converting first data constituted by bit data having a first number of bits into symbols having a second number of bits greater than the first number of bits, with respect to each of the bit data, a comparator that compares a first symbol string constituted by a plurality of symbols contained in the second data prior to reverse conversion of the acquired second data into the first data, to a second symbol string representing a code targeted for detection, and a detector that detects the first symbol string as the code targeted for detection from the second data, on the basis of the result of the comparison by the comparator.

According to the first embodiment of the present disclosure, second data obtained by converting first data constituted by bit data having a first number of bits into symbols having a second number of bits greater than the first number of bits is to be acquired with respect to each of the bit data, a first symbol string constituted by a plurality of symbols contained in the second data prior to reverse conversion of the acquired second data into the first data is to be compared to a second symbol string representing a code targeted for detection, and the first symbol string as the code targeted for detection from the second data is to be detected on the basis of the result of the comparison by the comparator.

According to a second embodiment of the present disclosure, there is provided an information processing device including an acquirer that acquires second data obtained by converting first data constituted by bit data having a first number of bits into symbols having a second number of bits greater than the first number of bits, with respect to each of the bit data, a reverse converter that generates the first data by converting the symbols constituting the acquired second data into the bit data, a comparator that compares corresponding bits of a first data string constituted by the plurality of bit data contained in the generated first data, and a second data string representing a code targeted for detection, a Hamming calculator that calculates a Hamming distance representing a number of corresponding bits of the first data string and the second data string that are not matched with each other, on the basis of the result of the comparison by the comparator, and a code detector that detects the first data string contained in the first data as the code targeted for detection when the calculated Hamming distance is equal to or less than a predetermined threshold value.

According to a second embodiment of the present disclosure, second data obtained by converting first data constituted by bit data having a first number of bits into symbols having a second number of bits greater than the first number of bits is to be acquired with respect to each of the bit data, the first data is to be generated by converting the symbols constituting the acquired second data into the bit data, corresponding bits of a first data string constituted is to be compared by the plurality of bit data contained in the generated first data, and a second data string representing a code targeted for detection, a Hamming distance representing a number of corresponding bits of the first data string and the second data string that are not matched with each other are to be calculated on the basis of the result of the comparison by the comparator, and the first data string contained in the first data as the code targeted for detection is to be detected when the calculated Hamming distance is equal to or less than a predetermined threshold value.

Advantageous Effects of Invention

According to the present disclosure, a control code can be detected accurately even when an error occurs in the control code.

BRIEF DESCRIPTION OF DRAWINGS

FIG. 3 is a diagram showing an example of a conversion table used in an 8B10B conversion.

FIG. 18 is a block diagram showing a configuration example of a computer.

DESCRIPTION OF EMBODIMENTS

Embodiments of the present disclosure (hereinafter, referred to as embodiments) will be described below. Incidentally, the description will be given in the following order.

1. First Embodiment (example of the case of detecting a control code from a packet after a 10B8B conversion by using a Hamming distance)
2. Second Embodiment (example of the case of detecting a control code from a packet prior to a 10B8B conversion by using a Hamming distance)
3. Third Embodiment (example of the case of performing parallel transmission)
4. Modification 1. First Embodiment

[Configuration Example of Transmission System 1]

Figure 1:
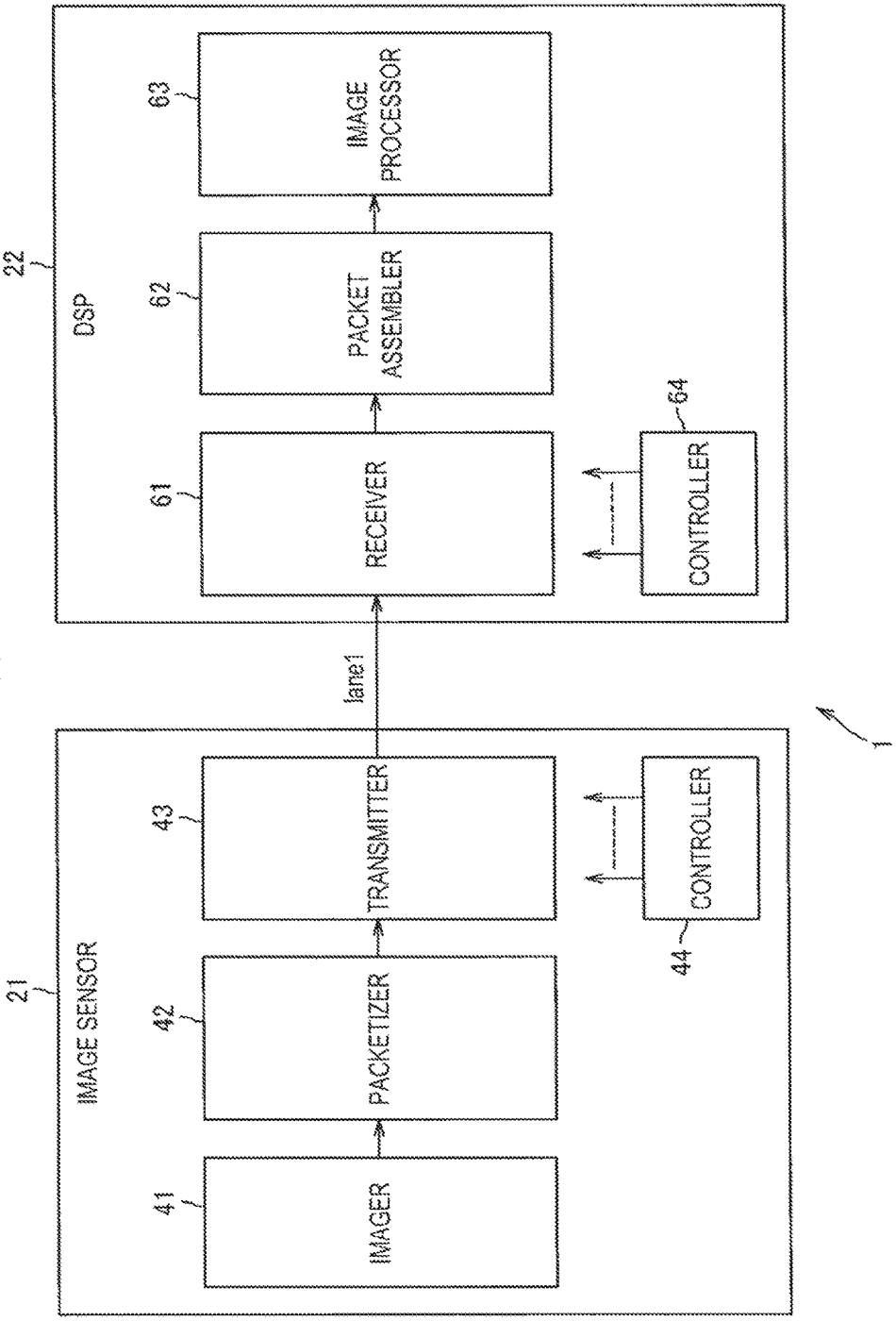
FIG. 1 is a block diagram showing a configuration example of a transmission system according to the present disclosure.

FIG. 1 shows a configuration example of a transmission system 1 according to a first embodiment.

The transmission system 1 includes an image sensor 21 and a DSP (digital signal processor) 22. The image sensor 21 and the DSP 22 are configured by different LSIs (large scale integration) or the like to realize a capturing function, and are provided inside, for example, a digital camera, a mobile phone, or the like.

In the transmission system 1, the image sensor 21 and the DSP 22 are connected through a single transmission line. The transmission line may be a wired transmission line (for example, a signal line), or may be a wireless transmission line. Incidentally, in FIG. 1, lane1 represents the single transmission line.

The image sensor 21 includes an imager 41, a packetizer 42, a transmitter 43, and a controller 44.

The imager 41 is constituted by, for example, a CMOS (complementary metal oxide semiconductor) or CCD (charge coupled device) imaging device. The imager 41 performs a photoelectric conversion on light received through a lens, and provides the packetizer 42 with an image signal obtained by the photoelectric conversion.

The packetizer 42 packetizes (partitions) the image signal from the imager 41 into a plurality of packets, and provides the transmitter 43 with the packets.

The transmitter 43 adds a control code to the packet from the packetizer 42. Examples of the control code include a start code representing a start position of the packet, an end code representing an end position of the packet, and the like.

Incidentally, as the control code, there is a pad code or a deskew code, in addition to the start code and the end code.

The pad code is added so as to fill a gap between a transmission rate of an image signal transmitted (output) from the imager 41 and a transmission rate of an image signal transmitted from the image sensor 21 (transmitter 43) to the DSP 22 (receiver 61).

That is, for example, in the case where the transmission rate of the imager 41 is 2 Gbps and the transmission rate of the transmitter 43 is 5 Gbps, the pad code is added so that the image signal is transmitted at 2 Gbps from the transmitter 43 to the receiver 61.

Also, a deskew code is added so as to correct a skew (delay of packet) occurring between a plurality of different transmission lines in the case where parallel transmission is performed to transmit packets in parallel from the image sensor 21 to the DSP 22 by using the plurality of transmission lines. Incidentally, since the transmission system 1 performs serial transmission, no skew occurs and the deskew code need not be added, but the deskew code is added for convenience.

Also, the transmitter 43 uses a previously held conversion table to perform an 8B10B conversion to convert the packet, to which the control code is added, into symbols representing a bit string of 10 bits with respect to each of bit data representing a bit string of 8 bits.

Then, the transmitter 43 serially transmits the packets after the 8B10B conversion to the DSP 22 through the single transmission line. Incidentally, details of the transmitter 43 will be described with reference to FIG. 2.

The controller 44 controls the imager 41, the packetizer 42, and the transmitter 43.

The DSP 22 includes a receiver 61, a packet assembler 62, an image processor 63, and a controller 64. Incidentally, a packet constituted by a plurality of symbols is transmitted from the transmitter 43 to the receiver 61 of the DSP 22 through the single transmission line.

The receiver 61 receives the packet transmitted from the transmitter 43 through the single transmission line, and performs a 10B8B conversion (8B10B reverse conversion) to convert the received packet into bit data of 8 bits with respect to each symbol of 10 bits.

Furthermore, the receiver 61 detects a data string whose Hamming distance to the data string representing the control code is equal to or less than a predetermined threshold value, as the control code, among the data strings contained in the packet after the 10B8B conversion.

Here, the data string refers to a string of bit data that are continuously arranged. Also, the Hamming distance refers to the number of the unmatched bits of the data string contained in the packet after the 10B8B conversion and the data string representing the control code.

Then, the receiver 61 eliminates the detected control code from the packet after the 10B8B conversion, and provides the packet assembler 62 with the packet after the elimination (which is constituted by only a part of the image signal).

As described above, the receiver 61 is configured to detect the control code from the packet after the 10B8B conversion by using the Hamming distance. However, the receiver 61 may detect the control code from the packet prior to the 10B8B conversion by using the Hamming distance.

Incidentally, the configuration of the receiver 61 when detecting the control code from the packet after the 10B8B conversion will be described in detail with reference to FIG. 4. Also, the configuration of the receiver 61 when detecting the control code from the packet prior to the 10B8B conversion will be described in detail with reference to FIG. 10.

The packet assembler 62 generates the same image signal as that output from the imager 41 of the image sensor 21 by assembling the respective packets from the receiver 61 (packets from which the control codes are eliminated), and provides the image processor 63 with the image signal.

The image processor 63 performs image processing (for example, noise removal or camera shake correction) on the image signal from the packet assembler 62, and outputs the image signal after the image processing. Incidentally, the image signal after the image processing is output to, for example, a storage unit or a display unit provided in a digital camera or a mobile phone incorporating the transmission system 1, so that the image signal is stored in the storage unit, or the image corresponding to the image signal is displayed on the display unit.

The controller 64 controls the receiver 61, the packet assembler 62, and the image processor 63.

[Configuration Example of Transmitter 43]

Figure 2:
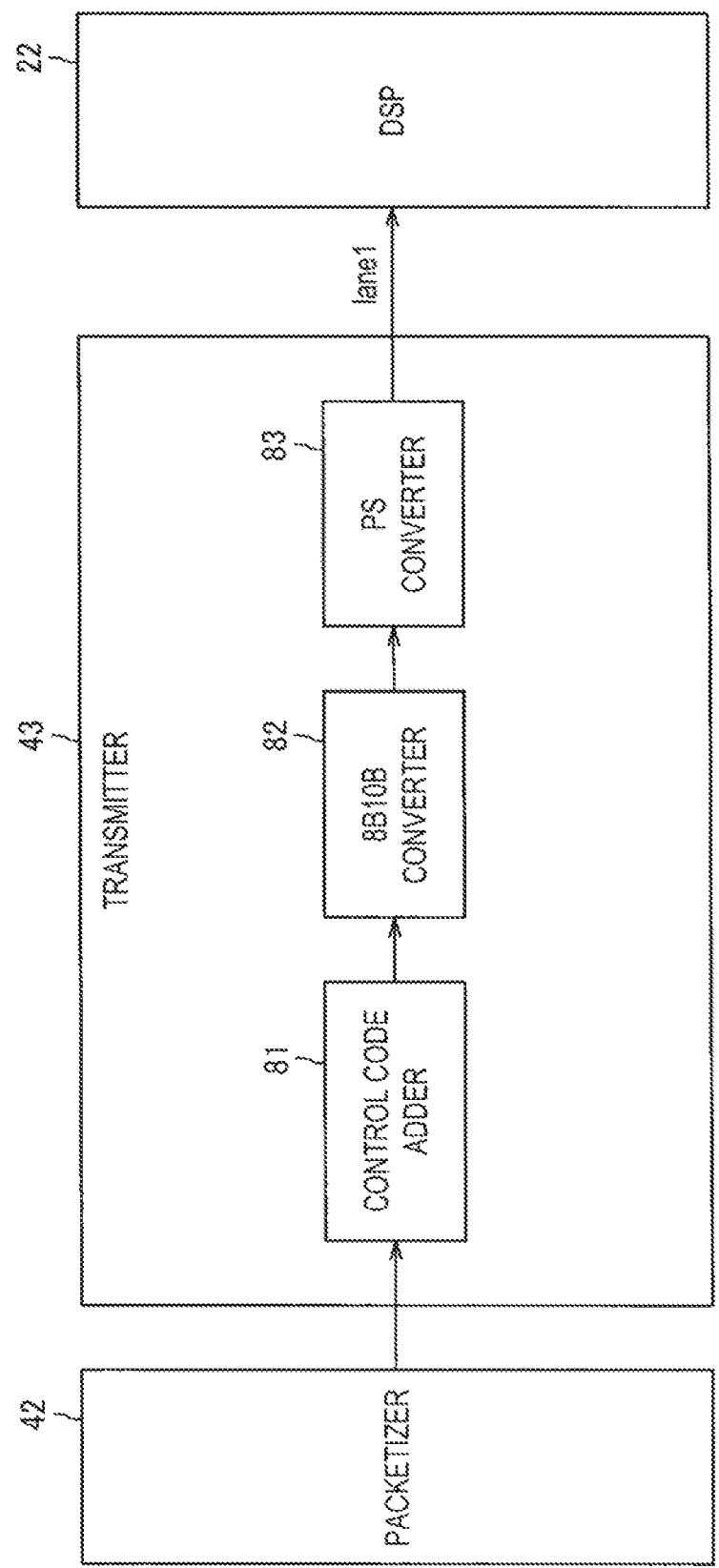
FIG. 2 is a block diagram showing a detailed configuration example of a transmitter of FIG. 1.

Next, FIG. 2 shows a configuration example of the transmitter 43 of FIG. 1.

The transmitter 43 includes a control code adder 81, an 8B10B converter 82, and a PS (parallel to serial) converter 83.

The control code adder 81 is provided with the packet from the packetizer 42. The control code adder 81 adds the control code to the packet from the packetizer 42, and provides the 8B10B converter 82 with the packet after the addition of the control code.

The 8B10B converter 82 uses a conversion table previously held in an internal memory (not shown) to perform an 8B10B conversion to convert the packet from the control code adder 81 into symbols of 10 bits with respect to each bit data of 8 bits.

Here, the packet provided from the control code adder 81 to the 8B10B converter 82 is constituted by a plurality of bit data. The bit data represents either a payload (in this case, a part of the image signal) or a part of the control code.

Incidentally, the 8B10B conversion is performed for preventing the same value (1 or 0) from being continuously arranged over a predetermined number in each bit of the packet to be transmitted. In this way, the DSP 22, which is the packet reception side, can easily achieve bit synchronization.

[Example of Conversion Table Used in 8B10B Conversion]

Next, FIG. 3 shows an example of the conversion table used in the 8B10B conversion.

FIG. 3 shows an example of the conversion table used when the 8B10B conversion is performed to convert the bit data of 8 bits (corresponding to "8B HGF_EDCBA" of FIG. 3), which is a part of the control code, into the symbol Kx.y of 10 bits (corresponding to "10B abcdei_fghj" of FIG. 3).

Incidentally, in the case where the 8B10B conversion is performed to convert the bit data of 8 bits as the payload into the symbol Dx.y of 10 bits, the 8B10B conversion is performed using the same conversion table as the conversion table used when the 8B10B conversion is performed on the bit data of 8 bits, which is a part of the control code.

Therefore, in FIG. 3, only the case where the 8B10B conversion is performed on the bit data of 8 bits, which is a part of the control code, will be described, and the case where the 8B10B conversion is performed on the bit data of 8 bits as the payload will be omitted.

The conversion table shown in FIG. 3 represents the correspondence relationship in the case where the lower 5 bits "EDCBA" among the respective bits constituting the bit data of 8 bits are bit-converted into the upper 6 bits "abcdei" among the respective bits constituting the symbol of 10 bits. Also, the conversion table shown in FIG. 3 represents the correspondence relationship in the case where the upper 3 bits "HGF" among the respective bits constituting the bit data of 8 bits are bit-converted into the lower 4 bits "fghj" among the respective bits constituting the symbol of 10 bits.

As the symbol Kx.y of 10 bits, there are two types of symbols corresponding to the bit data of 8 bits. Which one of the two types of symbols is to be output is determined by a running disparity value (hereinafter, referred to as an RD value) of a symbol output immediately before.

Here, the RD value refers to a value obtained by subtracting the number of 0's contained in the same symbol from the number of 1's contained in the symbol output immediately before.

That is, in FIG. 3, in the case where the RD value of the symbol output immediately before is positive, the symbol corresponding to the polarity "RD−" is subsequently output, and in the case where the RD value of the symbol output immediately before is negative, the symbol corresponding to the polarity "RD+" is subsequently output.

Incidentally, in the case where the RD value of the symbol output immediately before is 0, the symbol corresponding to the same polarity as the symbol output immediately before is subsequently output. Specifically, for example, in the case where the RD value of the symbol output immediately before is 0, the symbol corresponding to "RD−" is subsequently output when the polarity corresponding to the symbol output immediately before is "RD−".

Also, x of the symbol Kx.y represents a decimal value expressing the lower 5 bits "EDCBA" among the respective bits constituting the bit data prior to the 8B10B conversion. Also, y of the symbol Kx.y represents a decimal value expressing the upper 3 bits "HGF" among the respective bits constituting the bit data prior to the 8B10B conversion. The same is true of the symbol Dx.y.

Returning to FIG. 2, the 8B10B converter 82 provides the PS converter 83 with the packet after the 8B10B conversion.

The PS converter 83 performs a PS conversion so that the packet from the 8B10B converter 82 is converted from data for parallel transmission to data for serial transmission. Then, the PS converter 83 transmits the packet after the PS conversion to the DSP 22 through the transmission line (lane1) by serial transmission.

[Configuration Example of Receiver 61]

Figure 4:
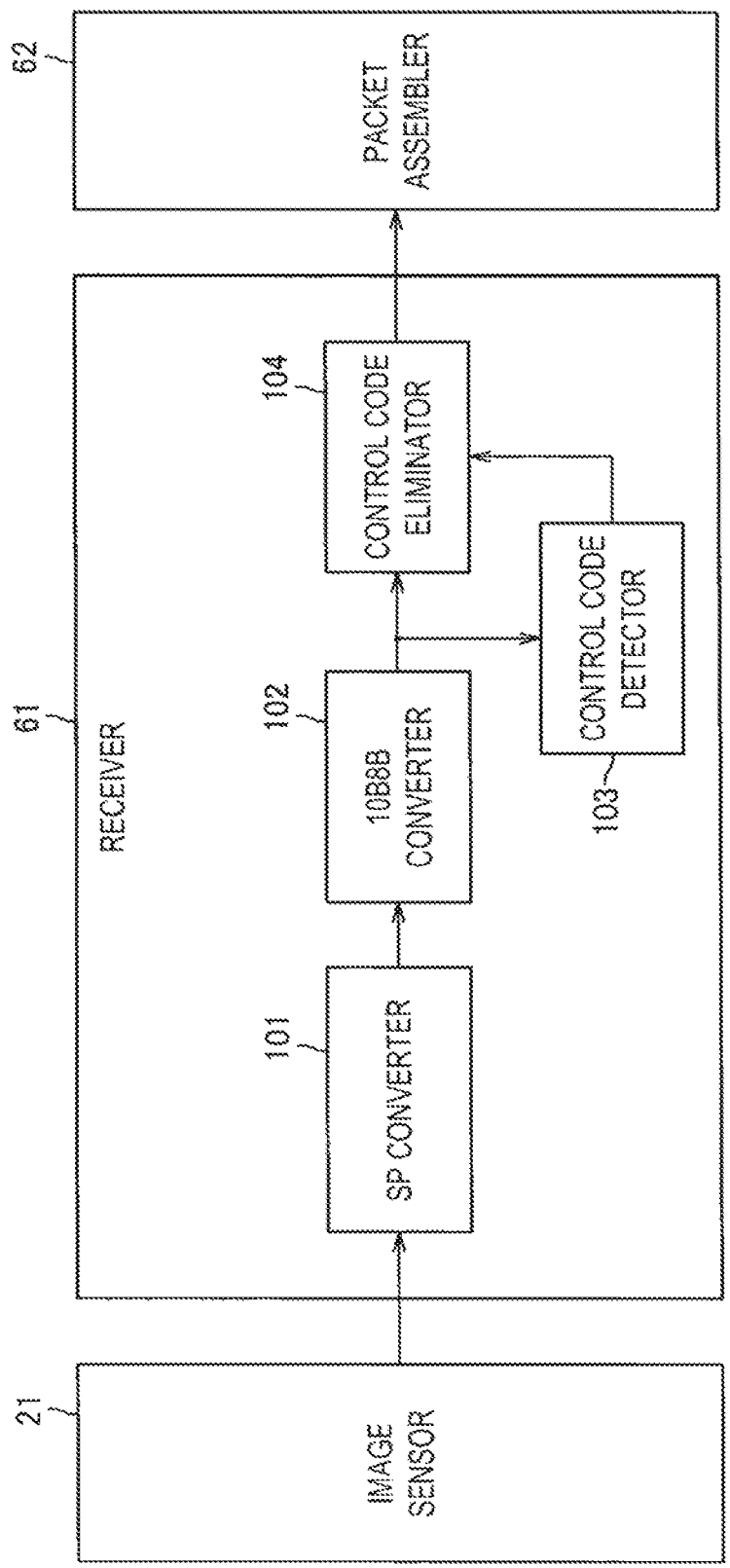
FIG. 4 is a block diagram showing a detailed configuration example of a receiver of FIG. 1.

Next, FIG. 4 shows a configuration example of the receiver 61 of FIG. 1.

The receiver 61 includes an SP (serial to parallel) converter 101, a 10B8B converter 102, a control code detector 103, and a control code eliminator 104.

The SP converter 101 receives each packet transmitted from the image sensor 21 through the transmission line (lane1). Then, the SP converter 101 performs an SP conversion (reverse conversion of the PS conversion) so that the received packet is converted from data for serial transmission to data for parallel transmission, and provides the 10B8B converter 102 with the packet after the SP conversion.

The 10B8B converter 102 previously holds the same conversion table as the conversion table previously held by the 8B10B converter 82 of the transmitter 43 (FIG. 2) in an internal memory (not shown).

The 10B8B converter 102 uses the conversion table previously held in the internal memory (not shown) to perform a 10B8B conversion (reverse conversion of the 8B10B conversion) to convert the packet from the SP converter 101 into the bit data of 8 bits with respect to each symbol of 10 bits.

Then, the 10B8B converter 102 provides the control code detector 103 and the control code eliminator 104 with the packet constituted by a plurality of bit data.

The control code detector 103 previously holds data representing the control code as a comparison data string in the internal memory (not shown) with respect to each control code targeted for detection (for example, a start code, an end code, a pad code, and a deskew code).

The control code detector 103 compares the data string contained in the packet from the 10B8B converter 102, to the previously held comparison data string.

Also, on the basis of the result of the comparison, the control code detector 103 detects a data string whose Hamming distance to the comparison data string is equal to or less than a predetermined threshold value, as the control code, among data strings contained in the packet from the 10B8B converter 102.

That is, for example, on the basis of the result of the comparison, the control code detector 103 calculates the Hamming distances to the comparison data string with respect to each of the data strings contained in the packet from the 10B8B converter 102.

Then, the control code detector 103 detects a data string corresponding to the Hamming distance equal to or less than the predetermined threshold value, as the control code, among the Hamming distances calculated with respect to each of the data strings contained the packet from the 10B8B converter 102.

Furthermore, on the basis of the result of the detection, the control code detector 103 generates control code information representing a position where the bit data as the control code exists among the respective bit data constituting the packet provided from the 10B8B converter 102 to the control code eliminator 104, with respect to each control code, and provides the control code eliminator 104 with the control code information.

The control code eliminator 104 eliminates the control code from the packet provided from the 10B8B converter 102, on the basis of the control code information from the control code detector 103. Then, the control code eliminator 104 provides the packet assembler 62 with the packet constituted by only the payload (in this case, a part of the image signal) by the elimination of the control code.

Figure 5:
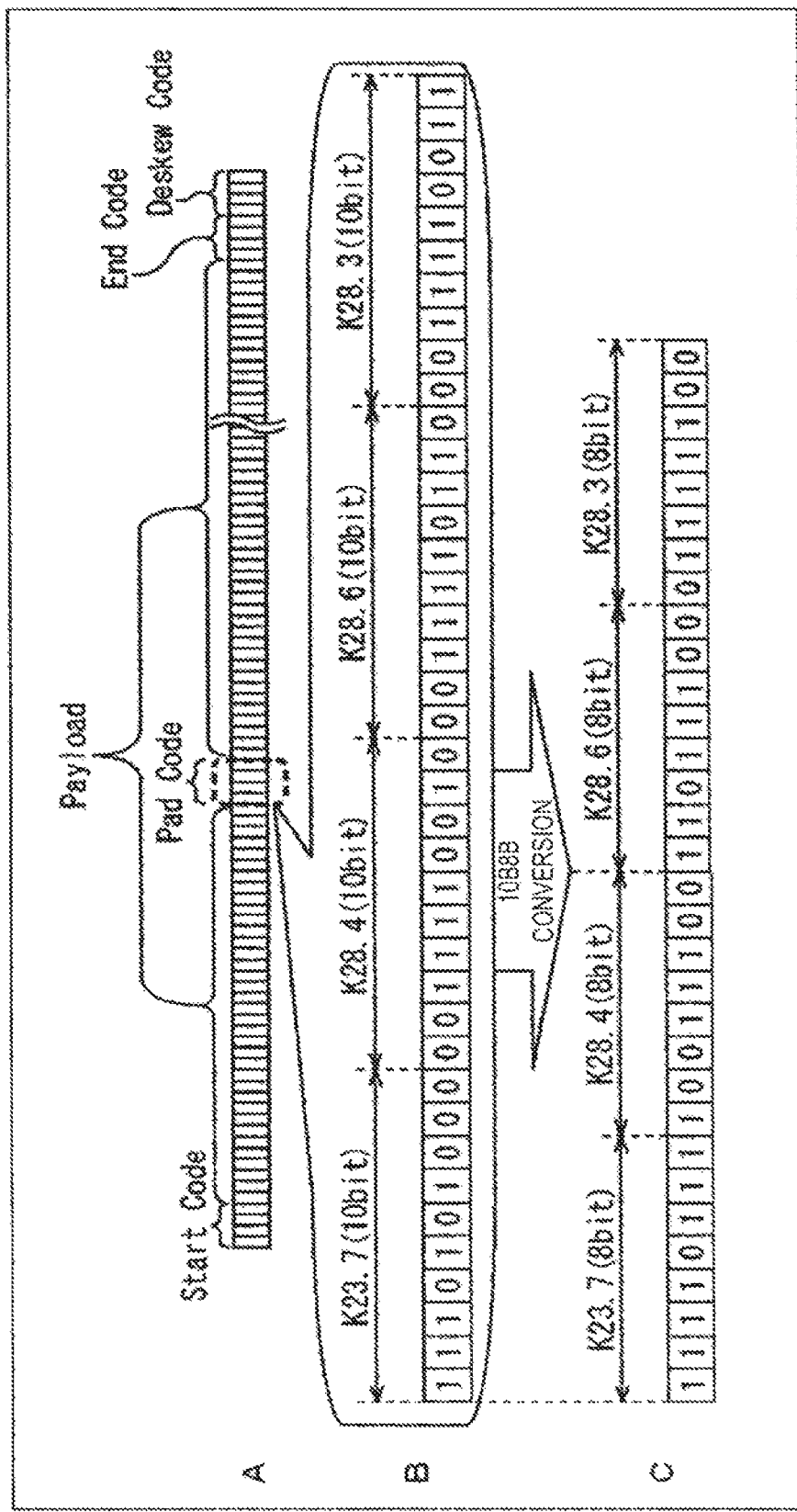
FIG. 5 is a diagram showing an example of a situation of a 10B8B conversion.

Next, FIG. 5 shows an example of a situation of the 10B8B conversion that is performed by the 10B8B converter 102.

A of FIG. 5 shows an example of the packet provided from the SP converter 101 to the 10B8B converter 102. As shown in A of FIG. 5, the packet includes payloads, a pad code added (inserted) between the payloads, a start code added to the beginning of the payload, an end code added to the end of the payload, and a deskew code added to the end of the end code.

Incidentally, each rectangle shown in A of FIG. 5 represents a symbol of 10 bits. Therefore, each of the start code, the pad code, the end code, or the deskew code is constituted by four symbols. Incidentally, the number of the symbols constituting the control code is not limited to four, and can be one, two, three, or five or more.

B of FIG. 5 shows a symbol string representing the pad code prior to the 10B8B conversion. That is, in B of FIG. 5, K23.7 (1110101000), K28.4 (0011110010), K28.6 (0011110110), and K28.3 (0011110011) are shown as four symbols Kx.y constituting the symbol string as the pad data.

C of FIG. 5 shows a data string representing the pad code after the 10B8B conversion. That is, in C of FIG. 5, "11110111" (K23.7), "10011100" (K28.4), "11011100" (K28.6), and "01111100" (K28.3) are shown as four bit data constituting the data string as the pad data.

The 10B8B converter 102 uses the previously held conversion table to perform the 10B8B conversion so that each symbol constituting the packet from the SP converter 101 (A of FIG. 5) is converted from the symbol of 10 bits (B of FIG. 5) to the symbol of 8 bits (C of FIG. 5).

Specifically, the 10B8B converter 102 performs the 10B8B conversion so that the four symbols (B of FIG. 5) representing, for example, the pad code as each symbol constituting the packet from the SP converter 101 (A of FIG. 5) are converted into the four bit data (C of FIG. 5).

The 10B8B converter 102 provides the control code detector 103 and the control code eliminator 104 with the packet after the 10B8B conversion.

Here, in the case of detecting, for example, the pad code from the packet output from the 10B8B converter 102, a method of detecting the data string matched with the comparison data string (data string constituted by a combination of K23.7, K28.4, K28.6, and K28.3 of 8 bits) as the pad code may be considered.

However, in the case where an error occurs in the pad code contained in the packet being transmitted through the transmission line (lane1), the above-described detecting method may not detect the pad code from the packet in which the error occurs.

Figure 6:
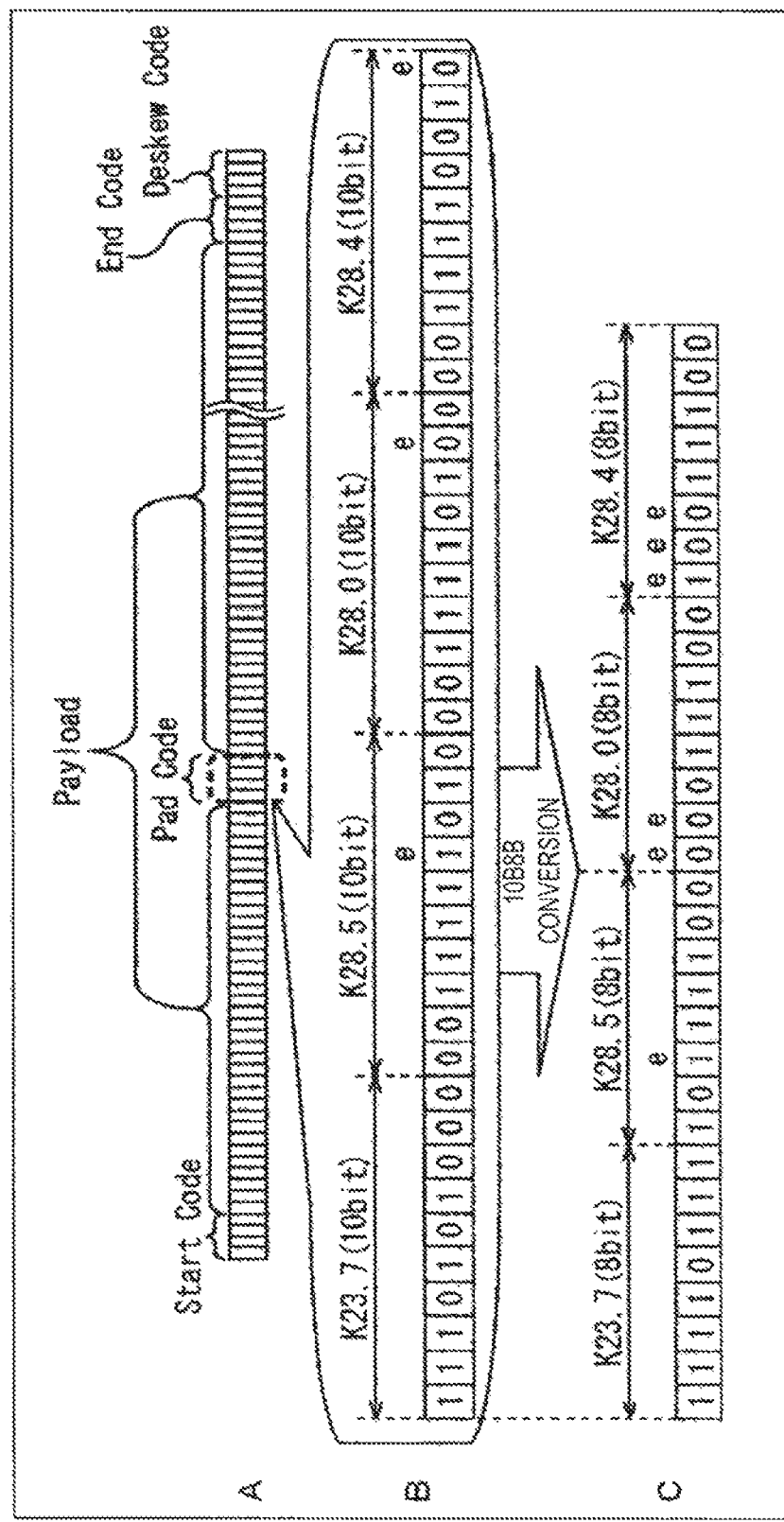
FIG. 6 is a diagram showing an example of the case where an error occurs in a pad code.

Next, FIG. 6 shows an example of the case where an error occurs in the pad code.

A of FIG. 6 shows the same packet as that of A of FIG. 5.

B of FIG. 6 shows an example of the case where an error occurs in the bits constituting the pad code prior to the 10B8B conversion shown in B of FIG. 5. Incidentally, in B of FIG. 6, bits, to which "e (error)" is assigned, represents bits inverted by the error, that is, bits different from the bits of the pad code shown in B of FIG. 5.

That is, in B of FIG. 6, K23.7 (1110101000), K28.5 (0011111010), K28.0 (0011110100), and K28.4 (0011110010) are shown as four symbols Kx.y constituting the symbol string as the pad code in which an error occurs.

C of FIG. 6 shows a data string obtained by performing the 10B8B conversion on the pad code shown in B of FIG. 6. Incidentally, in the data string shown in C of FIG. 6, bits, to which "e" is assigned, represents bits different from the bits of the pad code shown in C of FIG. 5.

That is, in C of FIG. 6, "11110111" (K23.7), "10111100" (K28.5), "00011100" (K28.0), and "10011100" (K28.4) are shown as four bit data constituting the data string obtained by performing the 10B8B conversion on the symbol string as the pad code shown in B of FIG. 6.

As shown in B of FIG. 6, for example, in the case where an error occurs in the pad code, the above-described detecting method may not detect the data string matched with the comparison data string, which is to be compared when detecting the pad code, from the packet output from the 10B8B converter 102.

In this case, the pad code cannot be detected from the packet output from the 10B8B converter 102. It can be said that this is true of the control codes other than the pad code.

Therefore, the control code detector 103 detects the data string whose Hamming distance to the comparison data string is equal to or less than the predetermined threshold value, as the control code, from the packet provided from the 10B8B converter 102.

Therefore, the control code detector 103 can detect the control code accurately even when an error occurs in the bits of the control code contained in the packet.

[Description about Operation of Transmission System 1]

Next, serial transmission processing performed by the transmission system 1 will be described with reference to the flowchart of FIG. 7.

The serial transmission processing is started, for example, when a subject is captured by the image sensor 21.

In step S1, the imager 41 of the image sensor 21 captures a subject, and provides the packetizer 42 with the image signal (captured image) obtained by the capturing. That is, for example, the imager 41 photoelectrically converts light received through the lens, and provides the packetizer 42 with the image signal obtained by the photoelectric conversion.

In step S2, the packetizer 42 packetizes (partitions) the image signal from the imager 41 into a plurality of packets, and provides the transmitter 43 with the packets.

In step S3, the transmitter 43 performs packet transmission processing to carry out the 8B10B conversion by adding the control code to the packet from the packetizer 42, and transmit the packet after the 8B10B conversion to the DSP 22. Incidentally, the packet transmission processing of step S3 will be described in detail with reference to the flowchart of FIG. 8.

In step S4, the receiver 61 of the DSP 22 performs packet reception processing to receive the packet transmitted from the transmitter 43 through the single transmission line, perform the 10B8B conversion (8B10B reverse conversion), and output the packet to the packet assembler 62 after eliminating the control code from the packet after the 10B8B conversion. Incidentally, the packet reception processing of step S4 will be described in detail with reference to the flowchart of FIG. 9.

In step S5, the packet assembler 62 generates the same image signal as that output from the imager 41 of the image sensor 21 by assembling the respective packets from the receiver 61 (packets from which the control codes are eliminated), and provides the image processor 63 with the generated image signal.

In step S6, the image processor 63 performs image processing (for example, noise removal or camera shake correction) on the image signal from the packet assembler 62, and outputs the image signal after the image processing. In this way, the serial transmission processing of FIG. 7 is ended.

Next, details of the packet transmission processing of step S3 of FIG. 7 will be described with reference to the flowchart of FIG. 8.

In step S21, the control code adder 81 adds the control code to the packet from the packetizer 42, and provides the 8B10B converter 82 with the packet after the addition of the control code.

In step S22, the 8B10B converter 82 uses a conversion table previously held in an internal memory (not shown) to perform an 8B10B conversion to convert the packet from the control code adder 81 into symbols of 10 bits with respect to each bit data of 8 bits. Then, the 8B10B converter 82 provides the PS converter 83 with the packet after the 8B10B conversion.

In step S23, the PS converter 83 performs a PS conversion so that the packet from the 8B10B converter 82 is converted from data for parallel transmission to data for serial transmission.

Then, the PS converter 83 transmits the packet after the PS conversion to the DSP 22 through the transmission line (lane1) by serial transmission. The processing is returned to step S3 of FIG. 7 and proceeds to step S4, and the packet reception processing is performed by the receiver 61 of the DSP 22.

Next, details of the packet reception processing of step S4 of FIG. 7 will be described with reference to the flowchart of FIG. 9.

In step S41, the SP converter 101 receives each packet transmitted from the image sensor 21 through the transmission line (lane1).

In step S42, the SP converter 101 performs an SP conversion (reverse conversion of the PS conversion) so that the received packet is converted from data for serial transmission to data for parallel transmission, and provides the 10B8B converter 102 with the packet after the SP conversion.

In step S43, the 10B8B converter 102 uses the conversion table previously held in the internal memory (not shown) to perform a 10B8B conversion (reverse conversion of the 8B10B conversion) to convert the packet from the SP converter 101 into the bit data of 8 bits with respect to each symbol of 10 bits.

Then, the 10B8B converter 102 provides the control code detector 103 and the control code eliminator 104 with the packet after the 10B8B conversion, that is, the packet constituted by a plurality of bit data.

In step S44, the control code detector 103 compares the data string contained in the packet from the 10B8B converter 102 (for example, data string constituted by four bit data) with the previously held comparison data string.

In step S45, on the basis of the result of the comparison in the processing of step S44, the control code detector 103 calculates the Hamming distance representing the number of unmatched bits among the corresponding respective bits of the data string contained in the packet from the 10B8B converter 102 and the comparison data string.

In step S46, on the basis of the calculated Hamming distance, the control code detector 103 detects the data string whose Hamming distance to the comparison data string is equal to or less than the predetermined threshold value, as the control code, among the data strings contained in the packet from the 10B8B converter 102.

Then, on the basis of the result of the detection, the control code detector 103 generates control code information representing a position where the bit data as the control code exists among the respective bit data constituting the packet provided from the 10B8B converter 102 to the control code eliminator 104, with respect to each control code, and provides the control code eliminator 104 with the control code information.

In step S47, the control code eliminator 104 eliminates the control code from the packet provided from the 10B8B converter 102, on the basis of the control code information from the control code detector 103.

Then, the control code eliminator 104 provides the packet assembler 62 with the packet constituted by only the payload (in this case, a part of the image signal) by the elimination of the control code. The processing is returned to step S4 of FIG. 7 and proceeds to step S5, and the subsequent processing is performed.

Figure 9:
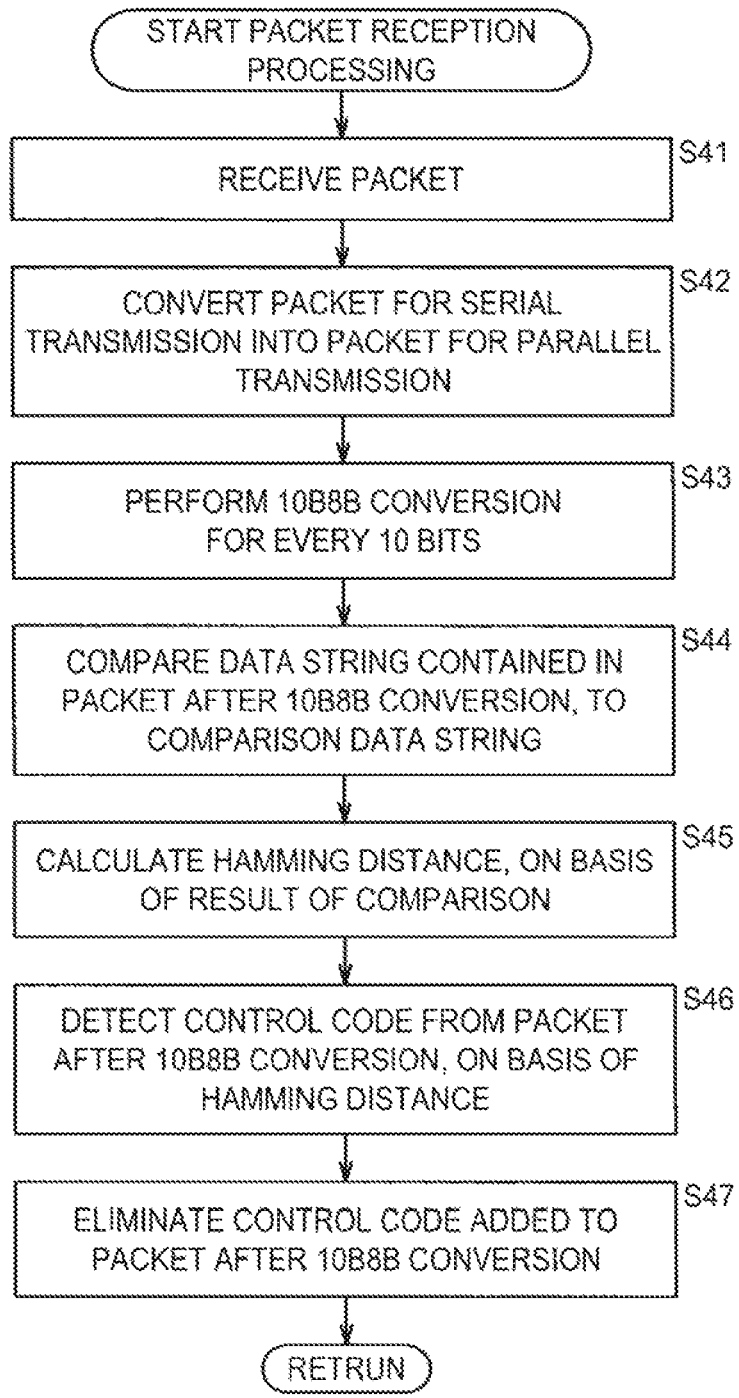
FIG. 9 is a flowchart for describing details of packet reception processing of step S4 of FIG. 7.

As described above, in step S46 of the packet reception processing of FIG. 9, the control code detector 103 detects the data string whose Hamming distance to the comparison data string is equal to or less than the predetermined threshold value, as the control code, among the data strings contained in the packet from the 10B8B converter 102.

Therefore, for example, the control code can be detected accurately even when an error occurs in the packet after the 10B8B conversion.

By the way, for example, even when the number of errors (the number of inverted bits) occurring in the symbol string prior to the 10B8B conversion is equal, the number of errors occurring in the data string obtained by the 10B8B conversion of the symbol string is different according to the positions where the errors occur.

Therefore, for example, in the case where it is known that errors occur in x bits contained in the symbol string on average in the transmission line (lane1), the threshold value of the Hamming distance cannot be simply determined to be x.

However, it is desirable that the threshold value of the Hamming distance be easily determined.

Therefore, in the receiver 61 of FIG. 1, the symbol string whose Hamming distance to the comparison symbol string is equal to or less than the predetermined threshold value among the symbol strings contained the packet prior to the 10B8B conversion may be detected as the control code.

In this case, when it is known that errors occur in x bits on average in the symbol string prior to the 10B8B conversion, the threshold value of the Hamming distance may be simply determined to be x.

2. Second Embodiment

[Another Configuration Example of Receiver 61]

Figure 10:
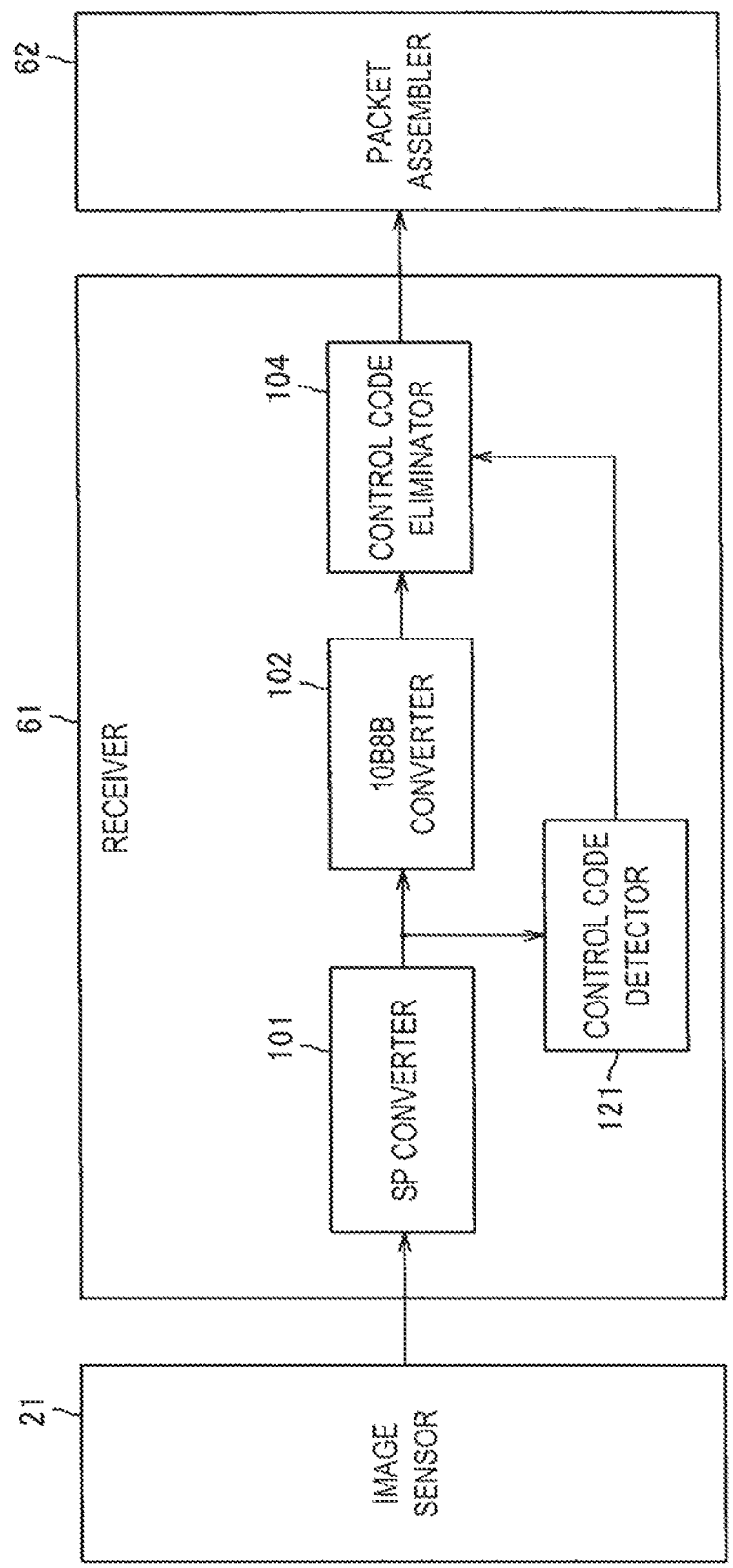
FIG. 10 is a block diagram showing another detailed configuration example of the receiver of FIG. 1.

Next, FIG. 10 shows a configuration example of the receiver 61 that detects the symbol string whose Hamming distance to the comparison symbol string is equal to or less than the predetermined threshold value, as the control code, among the symbol strings contained in the packet prior to the 10B8B conversion.

Incidentally, the receiver 61 of FIG. 10 is configured equally to the receiver 61 of FIG. 4, except that the receiver 61 of FIG. 10 detects the control code from the packet prior to the 10B8B conversion. In FIG. 10, since parts configured equally to those of the receiver 61 of FIG. 4 are assigned with the same reference numerals, a description thereof will be appropriately omitted below.

That is, in the receiver 61 of FIG. 10, a control code detector 121 is provided instead of the control code detector 103 of FIG. 4. Except that the control code detector 121 is provided, the receiver 61 of FIG. 10 is configured equally to the receiver 61 of FIG. 4.

Incidentally, the control code detector 121 is provided with the packet from the SP converter 101. Also, the control code detector 121 previously holds the symbol string representing the control code as a comparison symbol string in the internal memory (not shown) with respect to each control code targeted for detection.

The control code detector 121 compares the symbol string contained in the packet from the SP converter 101, to the previously held comparison symbol string.

Then, the control code detector 121 detects the symbol string as the control code from the packet output from the SP converter 101, on the basis of the result of the comparison.

That is, for example, the control code detector 121 calculates the Hamming distance to the comparison symbol string with respect to each of the symbol strings contained in the packet from the SP converter 101, on the basis of the result of the comparison.

Then, the control code detector 121 detects the symbol string whose Hamming distance is equal to or less than the predetermined threshold value, as the control code, among the Hamming distances of the symbol strings contained in the packet from the SP converter 101.

Also, on the basis of the result of the detection, the control code detector 121 generates control code information representing a position where the bit data as the control code exists among the respective bit data constituting the packet provided from the 10B8B converter 102 to the control code eliminator 104, with respect to each control code, and provides the control code eliminator 104 with the control code information.

Figure 11:
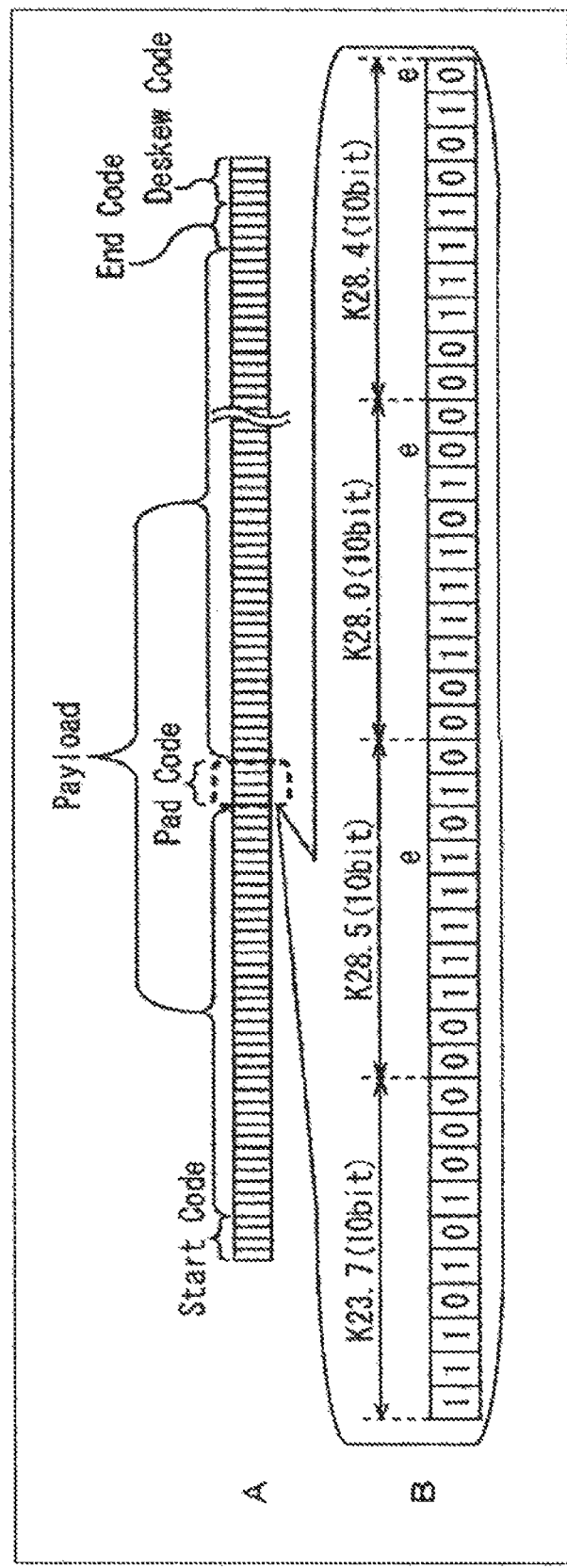
FIG. 11 is a diagram showing an example of a situation of the case where a control code detector of FIG. 10 detects a pad code.

Next, FIG. 11 shows an example of a situation of the case where the control code detector 121 detects, for example, the pad code as the control code from the packet provided from the SP converter 101.

Incidentally, A of FIG. 11 and B of FIG. 11 are configured equal to A of FIG. 6 and B of FIG. 6.

The control code detector 121 detects the symbol string whose Hamming distance to the comparison symbol string (symbol string constituted by a combination of K23.7, K28.4, K28.6, and K28.3 of 10 bits) is equal to or less than the predetermined threshold value (for example, 3), as the pad code, from the packet provided from the SP converter 101 (A of FIG. 11).

Here, for example, the reason why the threshold value is 3 is as follows. That is, the symbol Kx.y for the control code and the symbol Dx.y for the payload are constituted by different bit strings. Therefore, the Hamming distance between the comparison symbol string constituted by the symbol Kx.y and the symbol string (representing the payload) constituted by the symbol Dx.y is at least 4 or more. Therefore, the threshold value is set to less than 4 (for example, 3) so that the payload as the symbol string constituted by the symbol Dx.y cannot be detected as the control code such as the pad code.

In FIG. 11, the Hamming distance between the comparison symbol string and the symbol string (B of FIG. 11) representing the pad code contained in the packet provided from the SP converter 101 to the control code detector 121 is 3, which is equal to or less than the threshold value.

Therefore, the control code detector 121 detects the symbol string, which is constituted by four symbols K23.7, K28.5, K28.0, and K28.4 shown in B of FIG. 11, as the pad code.

[Description about Operation of Receiver 61 of FIG. 10]

Next, packet reception processing performed by the receiver 61 of FIG. 10 will be described with reference to the flowchart of FIG. 12.

Figure 12:
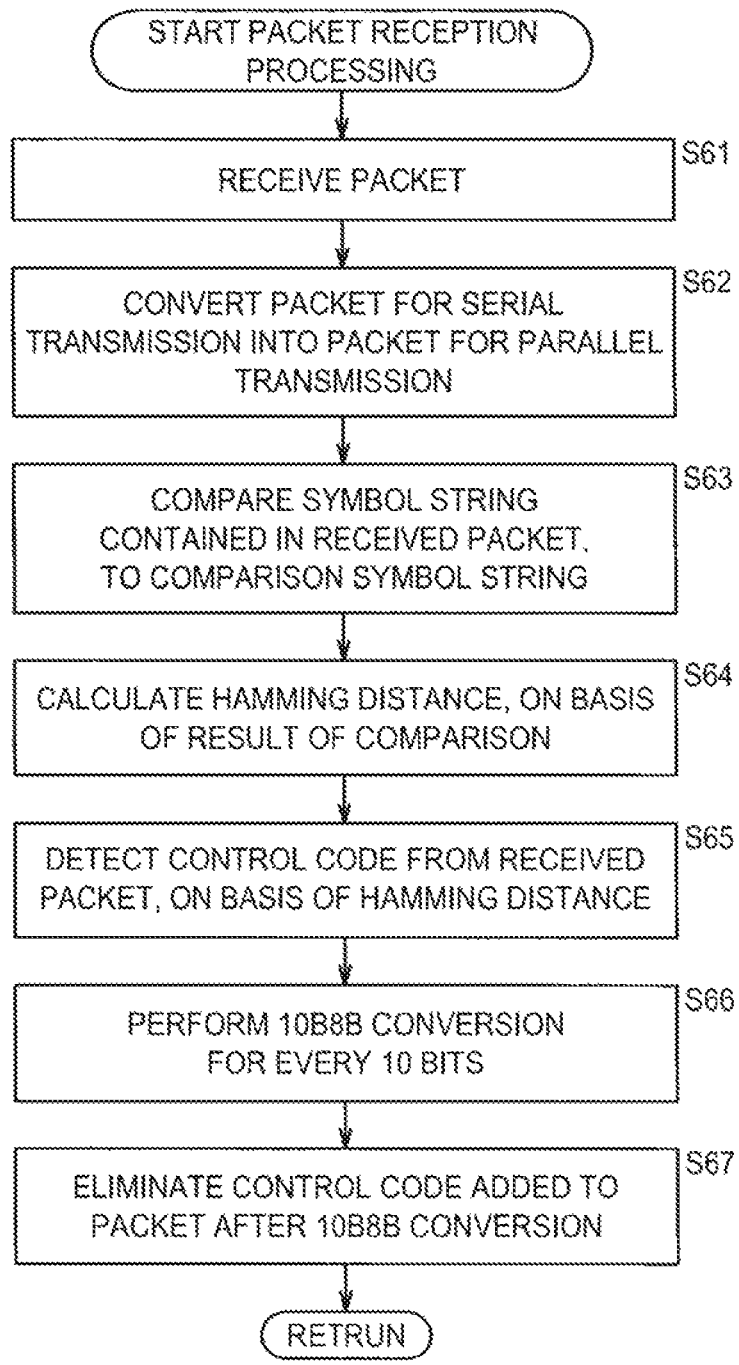
FIG. 12 is a flowchart for describing details of packet reception processing that is performed by the receiver of FIG. 10.

Incidentally, the packet reception processing of FIG. 12 is performed in step S4 of the serial transmission processing (FIG. 7) in the case where the receiver 61 of the transmission system 1 of FIG. 1 is configured as shown in FIG. 10.

In step S61, as in the case of step S41 of FIG. 9, the SP converter 101 receives each packet transmitted from the image sensor 21 through the transmission line (lane1).

In step S62, as in the case of step S42 of FIG. 9, the SP converter 101 performs SP conversion (reverse conversion of PS conversion) so that the received packet is converted from data for serial transmission to data for parallel transmission. Then, the SP converter 101 provides the 10B8B converter 102 and the control code detector 121 with the packet after the SP conversion.

In step S63, the control code detector 121 compares the symbol string contained in the packet from the SP converter 101, to the previously held comparison symbol string.

In step S64, on the basis of the result of the comparison in the processing of step S63, the control code detector 121 calculates the Hamming distance representing the number of the unmatched bits among the corresponding respective bits of the symbol string contained in the packet from the SP converter 101 and the comparison symbol string.

In step S65, on the basis of the calculated Hamming distance, the control code detector 121 detects the symbol string whose Hamming distance to the comparison symbol string is equal to or less than the predetermined threshold value, as the control code, among the symbol strings contained in the packet from the SP converter 101.

Then, on the basis of the result of the detection, the control code detector 121 generates control code information representing a position where the bit data as the control code exists among the respective bit data constituting the packet provided from the 10B8B converter 102 to the control code eliminator 104, with respect to each control code, and provides the control code eliminator 104 with the control code information.

In step S66, as in the case of step S43 of FIG. 9, the 10B8B converter 102 uses the conversion table previously held in the internal memory (not shown) to perform a 10B8B conversion (reverse conversion of the 8B10B conversion) to convert the packet from the SP converter 101 into the bit data of 8 bits with respect to each symbol of 10 bits.

Then, the 10B8B converter 102 provides the control code eliminator 104 with the packet after the 10B8B conversion, that is, the packet constituted by a plurality of bit data.

In step S67, as in the case of step S47 of FIG. 9, the control code eliminator 104 eliminates the control code from the packet provided from the 10B8B converter 102, on the basis of the control code information from the control code detector 121.

Then, the control code eliminator 104 provides the packet assembler 62 with the packet constituted by only the payload (in this case, a part of the image signal) by the elimination of the control code. The processing is returned to step S4 of FIG. 7 and proceeds to step S5, and the subsequent processing is performed.

As described above, in step S65 of the packet reception processing of FIG. 12, the control code detector 121 detects the control code from the packet prior to the 10B8B conversion.

Therefore, for example, it is possible to prevent the Hamming distance from becoming greater than the threshold value due to an increase in the number of errors by the 10B8B conversion. Therefore, as compared with the case of detecting the control code from the packet after the 10B8B conversion, the control code can be detected more accurately.

Also, in step S65 of the packet reception processing of FIG. 12, the control code detector 121 detects the symbol string whose Hamming distance to the comparison symbol string is equal to or less than the predetermined threshold value, as the control code, among the symbol strings contained in the packet prior to the 10B8B conversion.

However, for example, as compared with the case where the symbol string matched with the comparison symbol string among the symbol strings contained in the packet prior to the 10B8B conversion is detected as the control code, the control code detection accuracy can be improved.

For example, in the case where the probability Pe that an error will occur in 1 bit is Pe=1e−10 (−10th power of 1) and the pad code is represented by a symbol string of 40 bits, the probability that the pad code will be overlooked is considered.

In this case, for example, when the symbol string matched with the comparison symbol string among the symbol strings contained in the packet prior to the 10B8B conversion is detected as the pad code, the probability P1 that the pad code will be overlooked is as follows.

That is, the probability P1 is a probability that an error will occur in one or more of 40 bits, and P1=1−{(1−Pe)40}=4e−9.

On the other hand, when the symbol string whose Hamming distance to the comparison symbol string is equal to or less than the predetermined threshold value (3 in this case) among the symbol strings contained in the packet prior to the 10B8B conversion is detected as the control code, the probability P2 that the pad code will be overlooked is as follows.

That is, the probability P2 is a probability that an error will occur in four or more of 40 bits, and P2=1−{(1−Pe)40+40×Pe×(1−Pe)39+40×(39/2)×Pe2 (1−Pe)38+40×39×(38/2)×Pe3 (1−Pe)37}=9.14e−36. The probability P2 is less than the probability P1.

By the way, for example, in the case where the probability that a burst error to cause errors in successive bits will occur in the transmission line is high, the control code detector 121 may calculate the Hamming distance as if the number E1 of bit errors caused by the burst error is the number E2 less than the number E1.

In this case, even when the burst error occurs in the symbol string as the control code, it is possible to prevent the Hamming distance from becoming greater than the threshold value. Therefore, the control code detector 121 can detect the control code relatively accurately.

Figure 13:
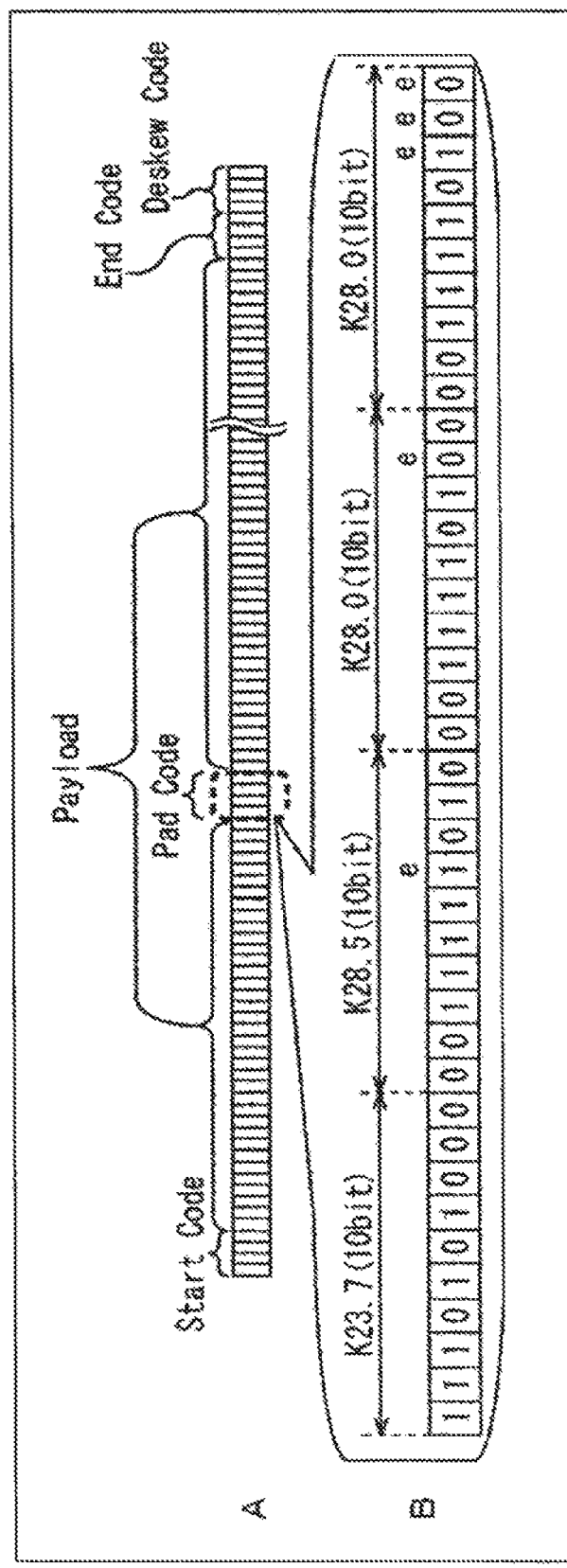
FIG. 13 is a diagram showing an example of a pad code in which a burst error occurs.

Next, FIG. 13 shows an example of the pad code in which a burst error occurs.

Incidentally, A of FIG. 13 is configured equally to A of FIG. 11. Also, B of FIG. 13 is configured equally to B of FIG. 11, except that the symbol K28.4 shown on the right side of B of FIG. 11 is replaced with a symbol K28.0.

In the symbol string as the pad code, which is shown in B of FIG. 13, the burst error occurs in three successive bits (three bits shown at the right end of the drawing).

For example, the control code detector 121 detects the symbol string whose Hamming distance to the comparison symbol string (symbol string constituted by a combination of K23.7, K28.4, K28.6, and K28.3 of 10 bits) is equal to or less than the predetermined threshold value (for example, 3), as the pad code, from the packet provided from the SP converter 101 (A of FIG. 13).

In FIG. 13, since the Hamming distance is 5, which is the same as the number of "e" shown in B of FIG. 13, and should be equal to or less than the threshold value, the symbol string shown in B of FIG. 13 is not detected as the pad code.

Therefore, for example, in the case where the probability that a burst error to cause errors in successive bits will occur in the transmission line is high, the control code detector 121 treats the number E1 (3 in this case) of errors, which are caused by the burst error shown in B of FIG. 13, as the number E2 (1 in this case).

In this case, the control code detector 121 calculates the value (3 in this case) equal to or less than the threshold value as the Hamming distance of the symbol string shown in FIG. 13, and detects the symbol string shown in FIG. 13 as the pad code.

With such a configuration, the control code detector 121 can detect the control code even when the burst error occurs in the symbol string as the control code (for example, the pad code) contained in the packet from the SP converter 101.

By the way, in the second embodiment, the threshold value of the Hamming distance is set to, for example, 3, but may be predetermined according to, for example, the frequency of error occurring in the transmission line (lane1).

That is, for example, in the case where it is known that errors in the transmission line occur in x bits on average among the bits constituting the symbol string, the threshold value of the Hamming distance is predetermined to be, for example, x.

Also, in the case where the frequency of error occurring in the transmission line is changed, the control code detector 121 may change the threshold value of the Hamming distance to a threshold value corresponding to the transmission line after the change. In this case, the control code detector 121 detects the control code from the packet provided from the SP converter 101 by using the threshold value after the change.

That is, for example, the control code detector 121 tries to detect the pad codes from p packets each including the pad code.

Then, the control code detector 121 calculates a detection rate q/p, on the basis of the number q of pad codes actually detected and the number p of pad codes contained in p packets.

When the calculated detection rate q/p is equal to or less than a first predetermined threshold value, the control code detector 121 changes the threshold value of the Hamming distance to a greater value so as to improve the detection rate. Therefore, the control code detector 121 can detect the control code accurately from the packet provided from the SP converter 101, regardless of a change in errors occurring in the packet.

Also, when the calculated detection rate q/p is equal to or less than a second threshold value (for example, 1.1) greater than the value of 1, the control code detector 121 detects even non-control code as the control code. Therefore, the control code detector 121 may change the threshold value of the Hamming distance to a smaller value. Incidentally, the second threshold value is greater than the first threshold value.

In this case, the control code detector 121 can suppress non-control code from being falsely detected from the packet provided from the SP converter 101, and can detect only the control code accurately.

In the first and second embodiments described above, the case of transmitting the packets from the image sensor 21 to the DSP 22 by the serial transmission has been described, but the packets can also be transmitted by, for example, the parallel transmission.

3. Third Embodiment

[Configuration Example of Transmission System 141]

Figure 14:
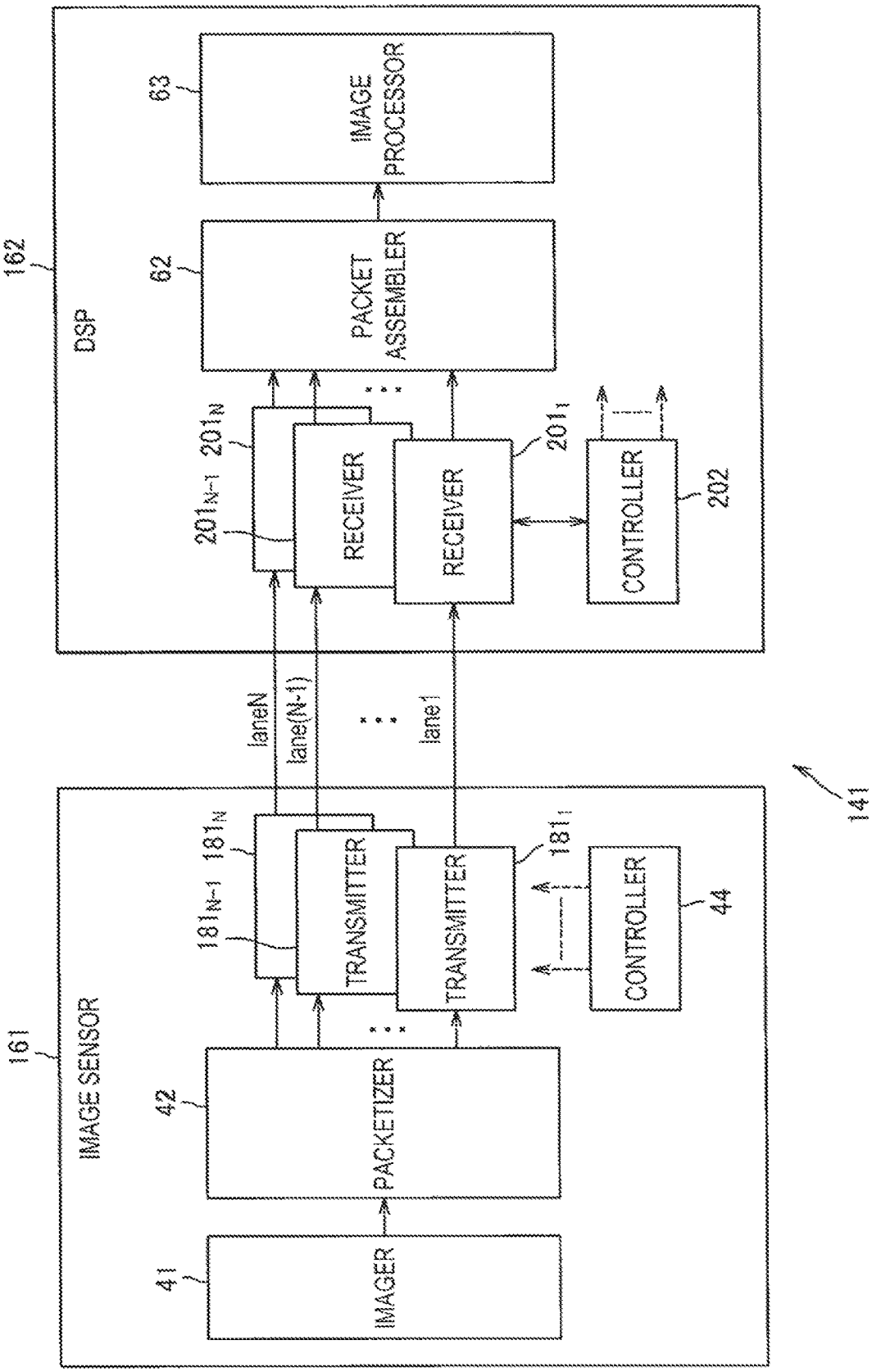
FIG. 14 is a block diagram showing another configuration example of the transmission system according to the present disclosure.

Next, FIG. 14 shows a configuration example of a transmission system 141 that transmits packets by parallel transmission.

The transmission system 141 includes an image sensor 161 and a DSP 162. The image sensor 161 and the DSP 162 are constituted by different LSIs or the like to realize a capturing function, and are provided inside, for example, a digital camera or a mobile phone.

Incidentally, in the transmission system 141, since parts configured equally to those of the transmission system 1 of the first embodiment are assigned with the same reference numerals, a description thereof will be appropriately omitted below.

That is, the transmission system 141 is configured equally to the transmission system 1 of FIG. 1, except that transmitters 181n (n=1, . . . , N−1, N) are provided instead of the transmitter 43 of the image sensor 21 of FIG. 1, and receivers 201n and a controller 202 are provided instead of the receiver 61 and the controller 64 of the DSP 22 of FIG. 1.

The transmitters 181n are provided with packets from a packetizer 42. As in the transmitter 43 of FIG. 1, the transmitters 181n add control codes to the packets from the packetizer 42, and perform an 8B10B conversion on the packets to which the control codes are added.

Then, the transmitters 181n transmit the packets after the 8B10B conversion to the receivers 201n of the DSP 162 through transmission lines (lane n) provided between the transmitters 181n and the receivers 201n.

Therefore, N packets are transmitted in parallel from the transmitters 1811 to 181N to the receivers 2011 to 201N.

As in the receiver 61 of FIG. 10, the receivers 201n receive the packets transmitted from the transmitters 181n through the transmission lines (lane n), and detect the control codes from the received packets.

Also, as in the receiver 61 of FIG. 10, the receivers 201n perform a 10B8B conversion on the received packets.

Furthermore, the receivers 201n provide the controller 202 with (information representing) timing when a deskew code is detected as the control code. On the other hand, correction information used to correct a skew is provided from the controller 202 to the receivers 201n.

Here, the skew refers to a deviation of timing when a plurality of packets transmitted in parallel is received.

The receivers 201n perform skew correction processing on the packets after the 10B8B conversion, on the basis of the correction information from the controller 202, so as to correct a skew occurring in the packets transmitted from the plurality of transmission lines (lane1 to lane N).

Then, the receivers 201n eliminate the detected control codes from the packets after the skew correction processing, and provide a packet assembler 62 with the packets after the elimination (only a part of the image signal).

That is, the receivers 201n are configured equally to the receiver 61 of FIG. 10, except that the receivers 201n perform the skew correction processing.

The controller 202 controls the receivers 2011 to 201N, the packet assembler 62, and an image processor 63.

Also, the controller 202 provides the receivers 2011 to 201N with a timing (time) obtained by adding a predetermined time to the latest timing among the plurality of timings, as the correction information, on the basis of the plurality of timings respectively provided from the receivers 2011 to 201N.

[Configuration Example of Receiver 201n]

Figure 15:
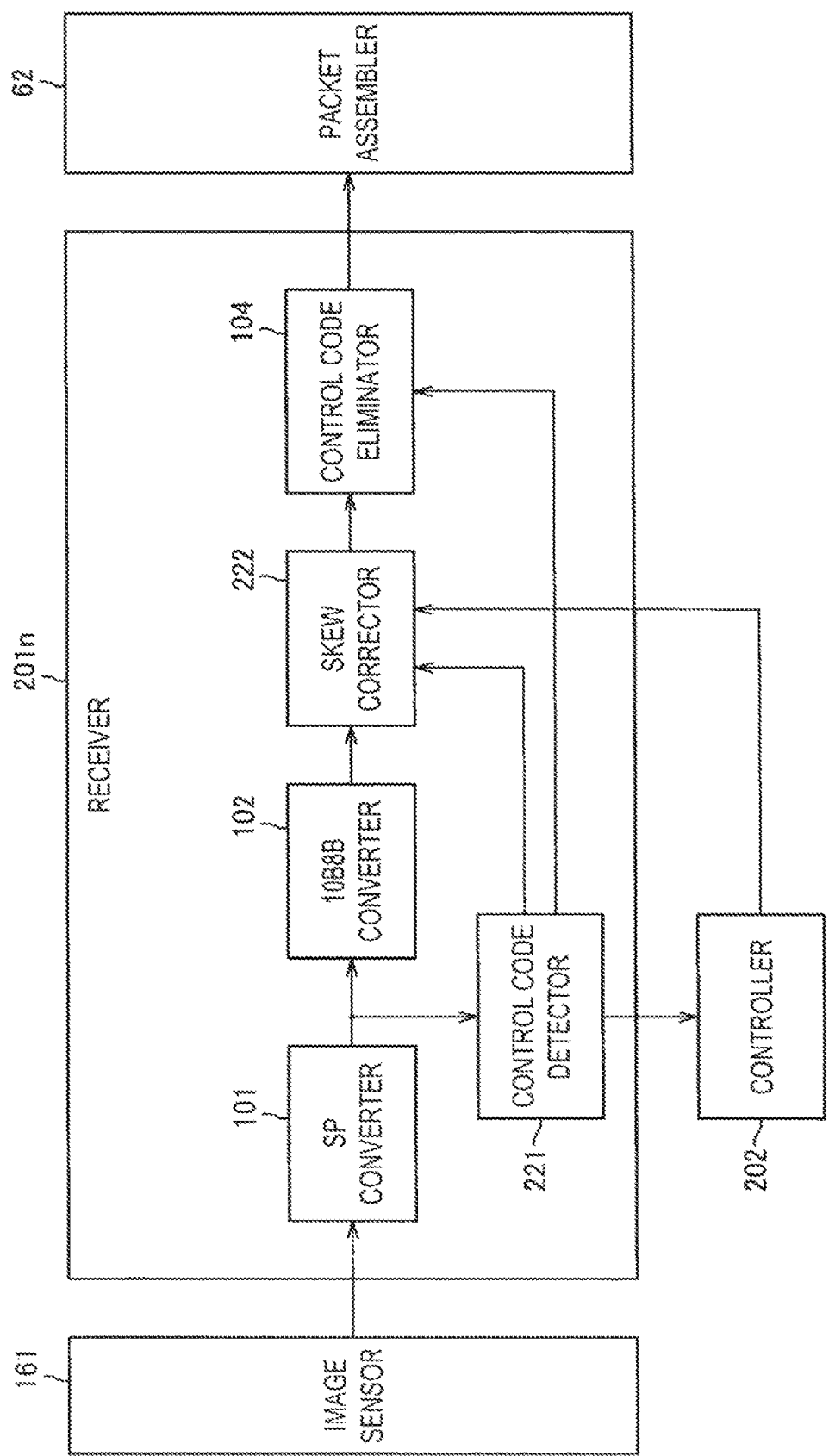
FIG. 15 is a block diagram showing a detailed configuration example of a receiver of FIG. 14.

Next, FIG. 15 shows a configuration example of the receiver 201n of FIG. 14.

Incidentally, the receiver 201n is configured equally to the receiver 61 of FIG. 10, except that the receiver 201n corrects the skew occurring in the received packet. In FIG. 15, since parts configured equally to those of the receiver 61 of FIG. 10 are assigned with the same reference numerals, a description thereof will be appropriately omitted below.

That is, the receiver 201n of FIG. 15 is configured equally to the receiver 61 of FIG. 10, except that a control code detector 221 is provided instead of the control code detector 121 of FIG. 10, and a skew corrector 222 is provided between a 10B8B converter 102 and a control code eliminator 104.

As in the control code detector 121 of FIG. 10, the control code detector 221 detects the symbol string as the control code from the packet provided from the SP converter 101.

That is, for example, the control code detector 221 compares the symbol string contained in the packet from the SP converter 101, to the previously held comparison symbol string.

Also, for example, the control code detector 221 calculates the Hamming distance to the comparison symbol string with respect to each of the symbol strings contained in the packet from the SP converter 101, on the basis of the result of the comparison.

Then, the control code detector 221 detects the symbol string whose Hamming distance is equal to or less than a predetermined threshold value, as the control code, among the Hamming distances of the symbol strings contained in the packet from the SP converter 101.

Furthermore, on the basis of the result of the detection, the control code detector 221 generates control code information representing a position where the bit data as the control code exists among the respective bit data constituting the packet provided to the control code eliminator 104, with respect to each control code, and provides the control code eliminator 104 with the control code information. Also, the control code detector 221 provides the skew corrector 222 with the control code information generated in the deskew code.

Furthermore, for example, the control code detector 221 provides the controller 202 with (information representing) timing when the deskew code is detected as the control code.

The skew corrector 222 is provided with the packet constituted by the bit data of 8 bits from the 10B8B converter 102, is provided with the control code information of the deskew code from the control code detector 221, and is provided with the correction information from the controller 202.

The skew corrector 222 corrects the skew occurring in the packet from the 10B8B converter 102, on the basis of the control code information of the deskew code from the control code detector 221 and the correction information from the controller 202. That is, for example, the skew corrector 222 outputs the packet from the 10B8B converter 102 to the control code eliminator 104, so that the deskew code contained in the packet from the 10B8B converter 102 is output at the timing represented by the correction information from the controller 202. Incidentally, all the packets transmitted by the parallel transmission are configured equally to each other (for example, configured so that the packet lengths are equal to each other and the control codes such as the deskew code exists at the same position).

Therefore, the plurality of packets transmitted in parallel from the transmitters 181 1 to 181N to the receivers 201 1 to 201N are provided from the skew corrector 222 to the control code eliminator 104 at the same timing in each of the receivers 201 1 to 201N. Therefore, the skew occurring between the plurality of packets transmitted in parallel is corrected.

[Description about Operation of Transmission System 141]

Figure 16:
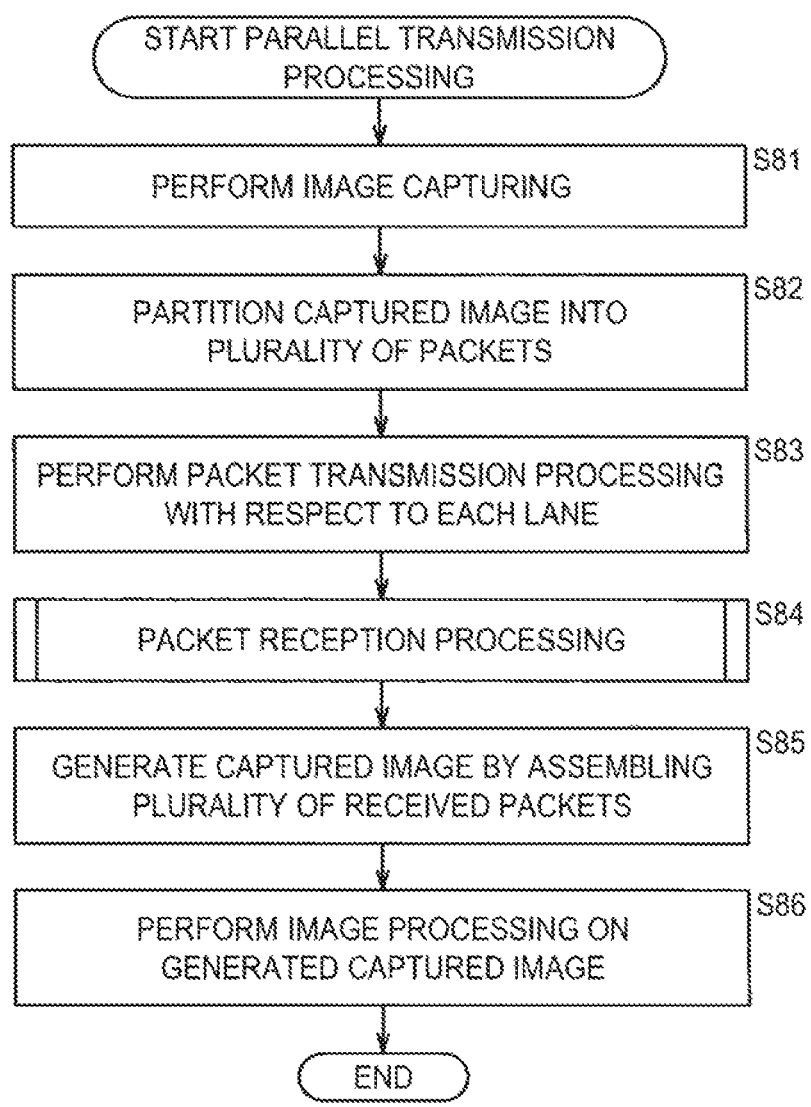
FIG. 16 is a flowchart for describing parallel transmission processing that is performed by the transmission system of FIG. 14.

Next, parallel transmission processing performed by the transmission system 141 will be described with reference to the flowchart of FIG. 16.

The parallel transmission processing is started, for example, when a subject is captured by the image sensor 161.

Figure 7:
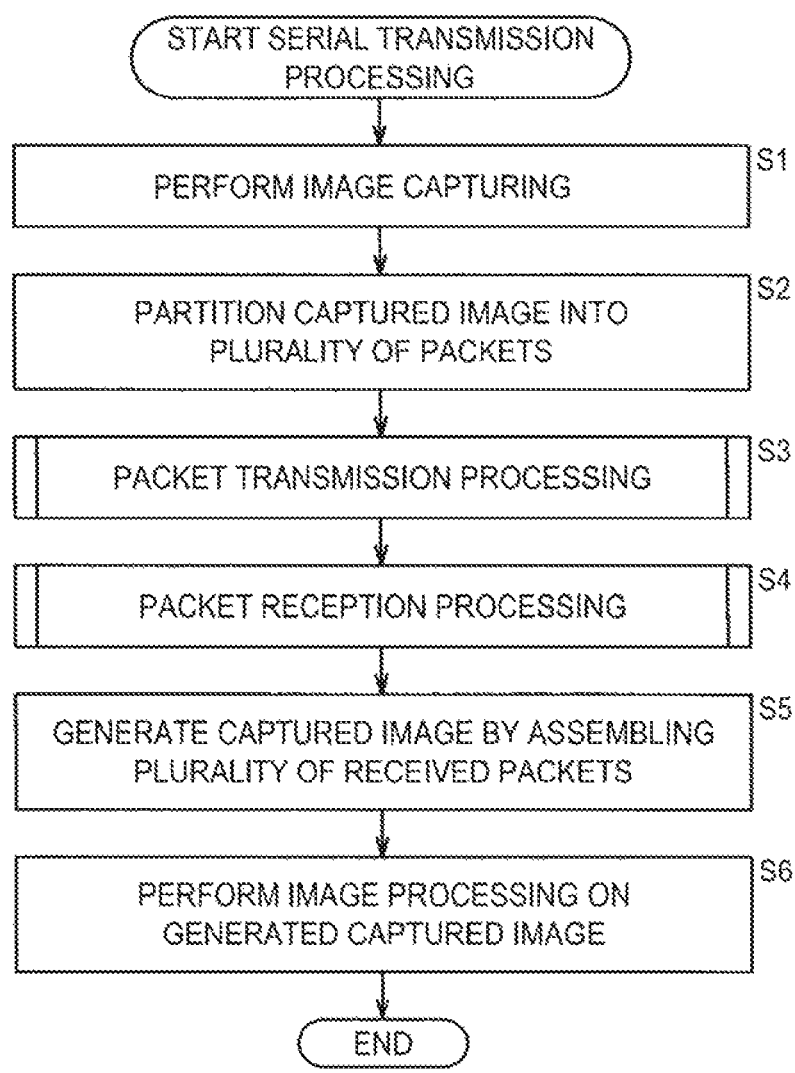
FIG. 7 is a flowchart for describing serial transmission processing that is performed by the transmission system of FIG. 1.
Figure 8:
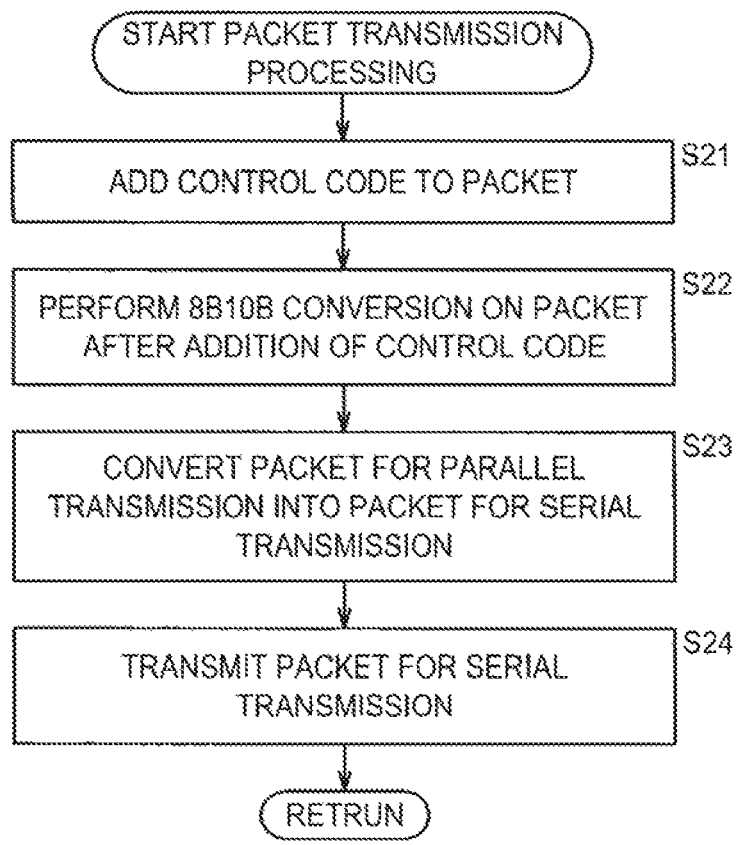
FIG. 8 is a flowchart for describing details of packet transmission processing of step S3 of FIG. 7.

In step S81, as in the case of step S1 of FIG. 7, the imager 41 of the image sensor 161 captures a subject, and provides the packetizer 42 with the image signal obtained by the capturing. That is, for example, the imager 41 of the image sensor 161 photoelectrically converts light received through the lens, and provides the packetizer 42 with the image signal obtained by the photoelectric conversion.

In step S82, the packetizer 42 of the image sensor 161 packetizes (partitions) the image signal from the imager 41 into a plurality of packets. Then, the packetizer 42 sequentially provides the transmitters 181 1 to 181N with the respective packets obtained by the packetization.

In step S83, as in the transmitter 43 of FIG. 1, each of the transmitters 181 1 to 181N performs packet transmission processing to perform the 8B10B conversion by adding the control code to the packet from the packetizer 42, and transmits the packet after the 8B10B conversion to the DSP 22.

In step S84, the receiver 201n of the DSP 162 performs packet reception processing to receive the packet transmitted from the transmitter 181n through the transmission line (lane n), perform the 10B8B conversion (8B10B reverse conversion) or the skew correction processing on the received packet, and output the packet to the packet assembler 62.

Incidentally, the packet reception processing of step S84 will be described in detail with reference to the flowchart of FIG. 17.

In step S85, the packet assembler 62 generates the same image signal as that output from the imager 41 of the image sensor 161 by assembling the respective packets provided from the respective receivers 201 1 to 201N (packets from which the control codes are eliminated), and provides the image processor 63 with the generated image signal.

In step S86, the image processor 63 of the DSP 162 performs image processing (for example, noise removal or camera shake correction) on the image signal from the packet assembler 62, and outputs the image signal after the image processing. In this way, the parallel transmission processing of FIG. 16 is ended.

Next, details of the packet reception processing of step S84 of FIG. 16 will be described with reference to the flowchart of FIG. 17.

In step S101, the SP converter 101 of the receiver 201n receives the packet transmitted from the image sensor 161 through the transmission line (lane n).

In step S102, the SP converter 101 performs an SP conversion (reverse conversion of the PS conversion) so that the received packet is converted from data for serial transmission to data for parallel transmission, and provides the 10B8B converter 102 and the control code detector 221 with the packet after the SP conversion.

In step S103, the control code detector 221 compares the symbol string contained in the packet from the SP converter 101, to the previously held comparison symbol string.

In step S104, on the basis of the result of the comparison in the processing of step S103, the control code detector 221 calculates the Hamming distance representing the number of unmatched bits among the corresponding respective bits of the symbol string contained in the packet from the SP converter 101 and the comparison symbol string.

In step S105, on the basis of the calculated Hamming distance, the control code detector 221 detects the symbol string whose Hamming distance to the comparison symbol string is equal to or less than the predetermined threshold value, as the control code, among the symbol strings contained in the packet from the SP converter 101.

Then, on the basis of the result of the detection, the control code detector 221 generates control code information representing a position where the bit data as the control code exists among the respective bit data constituting the packet provided from the skew corrector 222 to the control code eliminator 104, with respect to each control code, and provides the control code eliminator 104 with the control code information. Also, the control code detector 221 provides the skew corrector 222 with the control code information generated in the deskew code.

Furthermore, the control code detector 221 provides the controller 202 with a timing when the deskew code is detected as the control code.

In this way, the timing when the deskew code is detected in the control code detector 221 of each of the receivers 201 1 to 201N is provided from the control code detector 221 of each of the receivers 201 1 to 201N to the controller 202. Then, the controller 202 generates correction information on the basis of the plurality of timings from the control code detector 221 of each of the receivers 201 1 to 201N, and provides the correction information to the skew corrector 222 of each of the receivers 201 1 to 201N.

In step S106, as in the case of step S43 of FIG. 9, the 10B8B converter 102 uses the conversion table previously held in the internal memory (not shown) to perform a 10B8B conversion (reverse conversion of the 8B10B conversion) to convert the packet from the SP converter 101 into the bit data of 8 bits with respect to each symbol of 10 bits.

Then, the 10B8B converter 102 provides the skew corrector 222 with the packet after the 10B8B conversion, that is, the packet constituted by a plurality of bit data of 8 bits.

In step S107, the skew corrector 222 corrects the skew occurring in the packet from the 10B8B converter 102, on the basis of the control code information of the deskew code from the control code detector 221 and the correction information from the controller 202. That is, for example, the skew corrector 222 outputs the packet from the 10B8B converter 102 to the control code eliminator 104, so that the deskew code contained in the packet from the 10B8B converter 102 is output at the timing represented by the correction information from the controller 202.

In step S108, as in the case of step S47 of FIG. 9, the control code eliminator 104 eliminates the control code from the packet from the skew corrector 222, on the basis of the control code information from the control code detector 121.

Then, the control code eliminator 104 provides the packet assembler 62 with the packet constituted by only the payload (in this case, a part of the image signal) by the elimination of the control code. The processing is returned to step S84 of FIG. 16 and proceeds to step S85, and the subsequent processing is performed.

Figure 17:
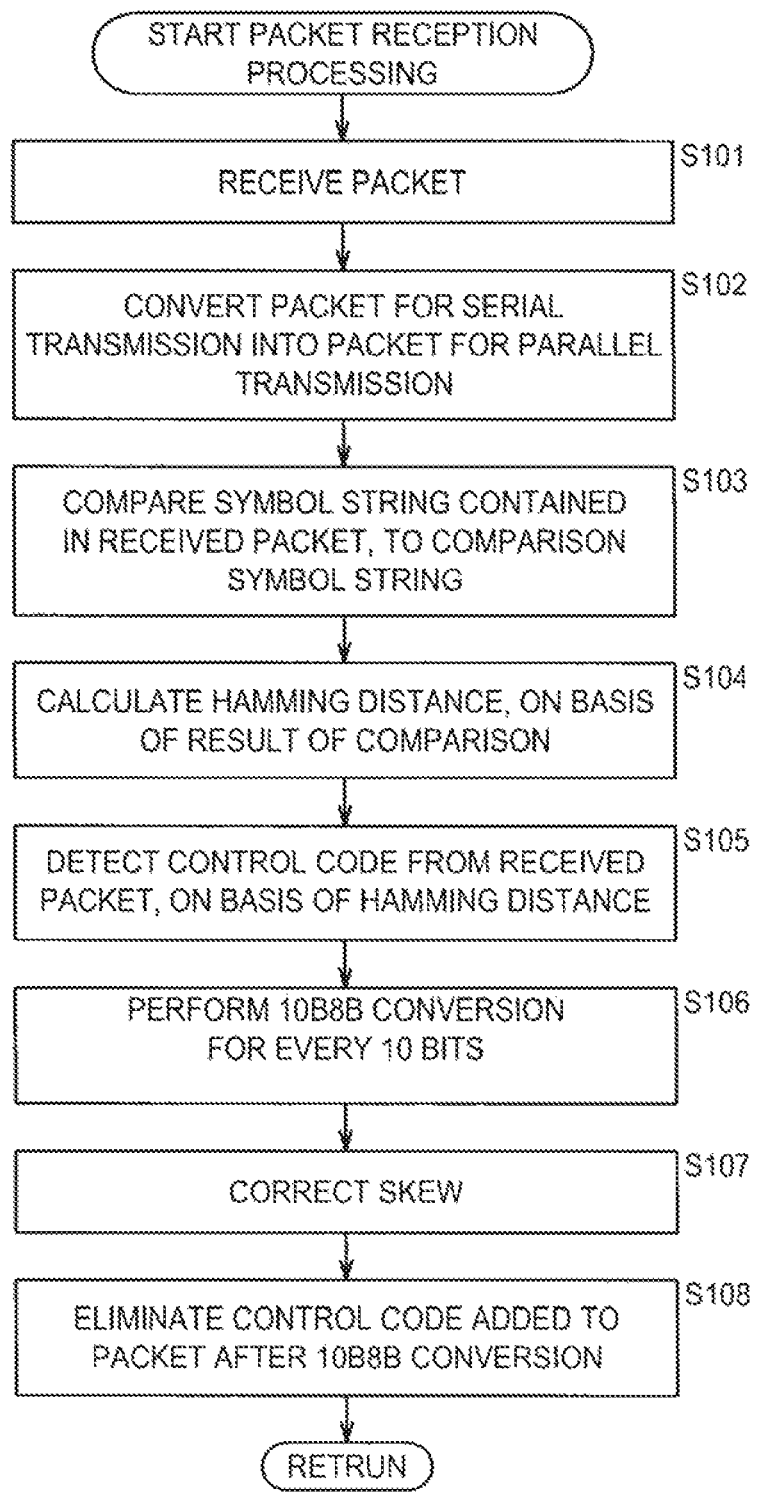
FIG. 17 is a flowchart for describing details of packet reception processing of step S84 of FIG. 16.

As described above, in step S105 of the packet reception processing of FIG. 17, the control code detector 221 detects the control code from the packet prior to the 10B8B conversion.

Therefore, for example, it is possible to prevent the Hamming distance from becoming greater than the threshold value due to an increase in the number of errors by the 10B8B conversion. Therefore, as compared with the case of detecting the control code from the packet after the 10B8B conversion, the control code can be detected more accurately.

Also, for example, in step S105, the control code detector 221 detects the symbol string whose Hamming distance to the comparison symbol string is equal to or less than the predetermined threshold value, as the control code, among the symbol strings contained in the packet prior to the 10B8B conversion.

However, for example, as compared with the case where the symbol string matched with the comparison symbol string among the symbol strings contained in the packet prior to the 10B8B conversion is detected as the control code, the control code detection accuracy can be improved.

4. Modification

In the second embodiment, the control code detector 121 detects, as the control code, the symbol string whose Hamming distance to the comparison symbol string is equal to or less than the predetermined threshold value among the symbol strings contained in the packet provided from the SP converter 101.

However, the control code detector 121 may detect the symbol string in which a majority of symbols are matched with the comparison symbol string among the plurality of symbols constituting the symbol string, as the control code contained in the packet from the SP converter 101. This is true of the control code detector 221 according to the third embodiment.

Also, as in the first embodiment, the control code detector 103 may detect the data string in which a majority of bit data are matched with the comparison data string among the plurality of bit data constituting the data string, as the control code contained in the packet from the 10B8B converter 102.

On the other hand, for example, each of the control code detectors 121 and 221 may detect the control code in different detecting methods with respect to each type of the control code.

That is, for example, regarding the start code, when three symbols among four symbols constituting the symbol string are matched with the comparison symbol string, the corresponding symbol string is detected as the start code. Incidentally, the end code is also detected in the same manner as the start code.

Then, for example, regarding the deskew code, when the symbol string is matched with the comparison symbol string, the corresponding symbol string is detected as the deskew code.

Furthermore, for example, regarding the pad code, when the Hamming distance between the symbol string and the comparison symbol string is equal to or less than the threshold value, the corresponding symbol string is detected as the pad code.

Incidentally, as in the control code detector 103 according to the first embodiment, the detection may be performed in different detecting methods with respect to each type of the control code.

In the first to third embodiments described above, the 8B10B conversion is performed on the image sensor side, but a pBqB conversion to convert bit data of p bits into symbols of q bits may be adopted instead of the 8B10B conversion. That is, for example, the image sensor can adopt a 3B4B conversion, a 5B6B conversion, a 64B66B conversion, a 64B67B conversion, a 128B130B conversion, and the like, instead of the 8B10B conversion.

In this case, the qBpB conversion (pBqB reverse conversion) to convert a symbol of q bits into bit data of p bits is performed on the DSP side. That is, for example, the DSP can adopt a 4B3B conversion, a 6B5B conversion, a 66B64B conversion, a 67B64B conversion, a 130B128B conversion, and the like, instead of the 10B8B conversion.

Also, in the first to third embodiments described above, the case of detecting, for example, the start code, the end code, the pad code, and the deskew code as the control code has been described, but other control codes can be detected.

Furthermore, in the first embodiment described above, the transmission system 1 that transmits data from the image sensor 21 to the DSP 22 has been described. However, for example, the present disclosure is not limited to the combination of the image sensor 21 and the DSP 22, and any combination may be applied as long as data is transmitted between different LSIs. This is true of the transmission system 141 according to the third embodiment.

Incidentally, the above mentioned series of processes can, for example, be executed by hardware, or can be executed by software. In the case where the series of processes is executed by software, a program configuring this software is installed in a computer from a medium recording a program. Here, examples of the computer include a computer incorporated into specialized hardware, and a general-purpose personal computer which is capable of executing various functions by installing various programs.

[Configuration Example of Computer]

FIG. 18 is shows a hardware configuration example of a computer that performs the above-described series of processing using a program.

A CPU (Central Processing Unit) 241 executes various processing according to programs stored in a ROM (Read Only Memory) 242 or a storage unit 248. The RAM (Random Access Memory) 243 appropriately stores the programs executed by the CPU 241, data, and the like. The CPU 241, the ROM 242, and the RAM 243 are connected to each other through a bus 244.

In addition, an input/output interface 245 is connected to the CPU 241 through the bus 244. An input unit 246 and output unit 247 are connected to the input/output interface 245, the input unit 246 including a keyboard, a mouse, a microphone, and the like, the output unit 247 including a display, a speaker, and the like. The CPU 241 executes various processing in accordance with respective instructions input from the input unit 246. Then, the CPU 241 outputs the processing result to the output unit 247.

The storage unit 248 connected to the input/output interface 245 includes, for example, a hard disk, and stores the programs to be executed by the CPU 241 and various data. A communication unit 249 communicates with an external apparatus through a network such as the Internet or a local area network.

In addition, programs may be acquired through the communication unit 249 and stored in the storage unit 248.

A drive 250 is connected to the input/output interface 245. When a removable medium 251 such as a magnetic disk, an optical disk, a magnetic-optical disk, or a semiconductor memory is loaded onto the drive 250, the drive 250 drives the removable medium 251 and acquires programs, data, and the like stored in the removable medium 251. The acquired programs and data are transferred to the storage unit 248 as necessary, and are stored in the storage unit 248.

The recording medium that records (stores) the program to be installed in the computer and made executable by the computer includes: the removable medium 251 which is a package medium including a magnetic disk (including a flexible disk), an optical disk (including a CD-ROM (Compact Disc-Read Only Memory), and a DVD (Digital Versatile Disc)), a magnetic-optical disk (including an MD (Mini-Disc)), a semiconductor memory, and the like; the ROM 242 that temporarily or permanently stores the programs; the hard disk forming the storage unit 248; and the like, as illustrated in FIG. 18. The program is recorded in the recording medium as necessary through the communication unit 249 which is an interface such as a router or a modem, by utilizing a wired or wireless communication medium such as a local area network, the Internet, or digital satellite broadcast.

In the present disclosure, steps of describing the above series of processes may include processing performed in time-series according to the description order and processing not processed in time-series but performed in parallel or individually.

In addition, the system in the specification includes a plurality of apparatuses, and represents the entirety thereof.

Further, the present disclosure is not limited to the first to the third embodiments described above, and various changes and modifications may be made without departing from the scope of the disclosure.

REFERENCE SIGNS LIST

1 transmission system
21 image sensor
22 DSP
41 imager
42 packetizer
43 transmitter
44 controller
61 receiver
62 packet assembler
63 image processor
64 controller
81 control code adder
82 8B10B converter
83 PS converter
101 SP converter
102 10B8B converter
103 control code detector
104 control code eliminator
121 control code detector
141 transmission system
161 image sensor
162 DSP
181$_1$ to 181$_N$ transmitter
201$_1$ to 201$_N$ receiver
202 controller
221 control code detector
222 skew corrector

The invention claimed is:

1. An information processing device, comprising:
   circuitry configured to:
   acquire first data having a first plurality of symbols,
      wherein the first data corresponds to image data, and
      wherein each of the first plurality of symbols has a first number of bits;
   generate second data having a second plurality of symbols, based on the first data,
      wherein each of the second plurality of symbols has a second number of bits, and
      wherein the second number is smaller than the first number;
   acquire a second data string that represents a control code;
   compare corresponding bits of a first data string constituted by the second plurality of symbols and the second data string;
   calculate a Hamming distance that represents a number of errors in the corresponding bits between the first data string and the second data string, based on the comparison;
   detect, as the control code, the first data string in the second data, based on the calculated Hamming distance that is equal to or less than a threshold value; and
   generate, based on the detection, an image signal that excludes the detected first data string.

2. The information processing device according to claim 1, wherein the circuitry is further configured to output the image signal for display on a display unit.

3. The information processing device according to claim 1, wherein the circuitry is further configured to change the threshold value for the Hamming distance, based on a detection rate of the control code.

4. A method, comprising:
   acquiring first data having a first plurality of symbols,
      wherein the first data corresponds to image data, and
      wherein each of the first plurality of symbols has a first number of bits;
   generating second data having a second plurality of symbols, based on the first data,
      wherein each of the second plurality of symbols has a second number of bits, and
      wherein the second number is smaller than the first number;
   acquiring a second data string that represents a control code;

comparing corresponding bits of a first data string constituted by the second plurality of symbols and the second data string;

calculating a Hamming distance that represents a number of errors in the corresponding bits between the first data string and the second data string, based on the comparison;

detecting, as the control code, the first data string in the second data, based on the calculated Hamming distance that is equal to or less than a threshold value; and generating, based on the detection, an image signal that excludes the detected first data string.

5. The method according to claim 4, further comprising outputting the image signal for display on a display unit.

6. The method according to claim 4, further comprising changing the threshold value for the Hamming distance, based on a detection rate of the control code.

7. A non-transitory computer-readable medium having stored thereon computer-executable instructions for causing a computer to execute operations, the operations comprising:

acquiring first data having a first plurality of symbols, wherein the first data corresponds to image data, and wherein each of the first plurality of symbols has a first number of bits;

generating second data having a second plurality of symbols, based on the first data,
wherein each of the second plurality of symbols has a second number of bits, and
wherein the second number is smaller than the first number;

acquiring a second data string that represents a control code;

comparing corresponding bits of a first data string constituted by the second plurality of symbols and the second data string;

calculating a Hamming distance that represents a number of errors in the corresponding bits between the first data string and the second data string, based on the comparison;

detecting, as the control code, the first data string in the second data, based on the calculated Hamming distance that is equal to or less than a threshold value; and generating, based on the detection, an image signal that excludes the detected first data string.

\* \* \* \* \*